(12) United States Patent
Inoue et al.

(10) Patent No.: US 8,735,935 B2
(45) Date of Patent: May 27, 2014

(54) SMALL SIZE LIGHT EMITTING DEVICE AND MANUFACTURING METHOD OF THE SAME

(75) Inventors: Tomio Inoue, Gyunggi-do (KR); Tsuyoshi Tsutsui, Gyunggi-do (KR); Jae Joon Yoon, Gyunggi-do (KR); Ok Hee Shin, Gyunggi-do (KR)

(73) Assignee: Samsung Electronics Co., Ltd, Seoul (KR)

( * ) Notice: Subject to any disclaimer, the term of this patent is extended or adjusted under 35 U.S.C. 154(b) by 194 days.

(21) Appl. No.: 13/070,014

(22) Filed: Mar. 23, 2011

(65) Prior Publication Data

US 2011/0169035 A1    Jul. 14, 2011

Related U.S. Application Data

(62) Division of application No. 12/081,888, filed on Apr. 23, 2008, now abandoned.

(30) Foreign Application Priority Data

Apr. 23, 2007  (KR) .................. 10-2007-0039402
Apr. 22, 2008  (KR) .................. 10-2008-0036995

(51) Int. Cl.
    *H01L 33/00*    (2010.01)
(52) U.S. Cl.
    USPC ............... 257/100; 257/98; 257/99; 257/666; 257/676; 257/E33.059
(58) Field of Classification Search
    USPC ............... 257/98, 99, 100, E33.059, 666, 676
    See application file for complete search history.

(56) References Cited

U.S. PATENT DOCUMENTS

| | | | |
|---|---|---|---|
| 5,864,206 A | 1/1999 | Ishihara et al. | |
| 6,723,585 B1 * | 4/2004 | Tu et al. | 438/123 |
| 6,874,910 B2 | 4/2005 | Sugimoto et al. | |
| 7,125,747 B2 * | 10/2006 | Lee et al. | 438/112 |
| 7,297,293 B2 | 11/2007 | Tamaki et al. | |

(Continued)

FOREIGN PATENT DOCUMENTS

| | | |
|---|---|---|
| JP | 8-045972 | 2/1996 |
| JP | 10-41545 | 2/1998 |

(Continued)

OTHER PUBLICATIONS

Japanese Office Action issued in Japanese Patent Application No. 2008-113118, dated Jan. 4, 2011.

(Continued)

*Primary Examiner* — Alexander Sofocleous
*Assistant Examiner* — John P Dulka
(74) *Attorney, Agent, or Firm* — McDermott Will & Emery LLP

(57) ABSTRACT

There is provided a light emitting device including: a package body having first and second circumferential surfaces and a plurality of side surfaces formed therebetween, the package body defined into first and second level areas including the first and second circumferential surfaces, respectively; first and second external terminal blocks each having an electrical contact part; an LED chip disposed between the first and second external terminal blocks in the first level area and having an electrode surface where first and second electrodes are formed; and wires electrically connected to first and second electrodes of the LED chip to the electrical contact parts of the first and second external terminal blocks, respectively.

27 Claims, 18 Drawing Sheets

(56) References Cited

U.S. PATENT DOCUMENTS

| | | | |
|---|---|---|---|
| 7,942,550 B2* | 5/2011 | Inoue et al. | 362/249.02 |
| 8,043,876 B2* | 10/2011 | Lee et al. | 438/28 |
| 8,143,634 B2* | 3/2012 | Park et al. | 257/98 |
| 2001/0022021 A1 | 9/2001 | Maekawa | |
| 2002/0185649 A1 | 12/2002 | Oshio | |
| 2004/0061124 A1 | 4/2004 | Trottier et al. | |
| 2004/0065894 A1* | 4/2004 | Hashimoto et al. | 257/100 |
| 2005/0102827 A1 | 5/2005 | Tseng et al. | |
| 2005/0140291 A1 | 6/2005 | Hirakata et al. | |
| 2005/0162069 A1* | 7/2005 | Ota et al. | 313/501 |
| 2006/0231852 A1 | 10/2006 | Kususe et al. | |
| 2006/0267040 A1* | 11/2006 | Baek et al. | 257/99 |
| 2008/0315239 A1* | 12/2008 | Lin et al. | 257/99 |
| 2011/0121339 A1* | 5/2011 | Wu | 257/98 |
| 2012/0217525 A1* | 8/2012 | Chan et al. | 257/98 |
| 2012/0241789 A1* | 9/2012 | Chan et al. | 257/98 |

FOREIGN PATENT DOCUMENTS

| | | | |
|---|---|---|---|
| JP | 10-144966 | | 5/1998 |
| JP | 11-054804 | | 2/1999 |
| JP | 2000-150962 | A | 5/2000 |
| JP | 2001-111119 | A | 4/2001 |
| JP | 2002-314138 | A | 10/2002 |
| JP | 2003-008082 | | 1/2003 |
| JP | 2003-142735 | | 5/2003 |
| JP | 2004-087973 | | 3/2004 |
| JP | 2004-119984 | A | 4/2004 |
| JP | 2005-327786 | A | 11/2005 |
| JP | 2005327786 | A * | 11/2005 |
| JP | 2006-237285 | A | 9/2006 |
| JP | 2007-027157 | | 2/2007 |
| JP | 2007-073575 | A | 3/2007 |
| JP | 2007-096361 | A | 4/2007 |
| JP | 2007-270004 | A | 10/2007 |
| KR | 10-2004-0031882 | | 4/2004 |
| KR | 10-0714628 | B1 | 4/2007 |
| WO | WO 2007/025515 | A1 | 3/2007 |

OTHER PUBLICATIONS

Japanese Office Action, w/ English translation thereof, issued in Japanese Patent Application No. JP 2011-090804 dated Jul. 2, 2013.

* cited by examiner

SMALL SIZE LIGHT EMITTING DEVICE AND MANUFACTURING METHOD OF THE SAME

CROSS-REFERENCE TO RELATED APPLICATIONS

This application is a Divisional of U.S. patent application Ser. No. 12/081,888, filed on Apr. 23, 2008, and claims the priorities of Korean Patent Application No. 2007-0039402 filed on Apr. 23, 2007, and Korean Patent Application No. 2008-0036995 filed on Apr. 22, 2008, in the Korean Intellectual Property Office, the disclosure of which are incorporated herein by reference.

BACKGROUND OF THE INVENTION

1. Field of the Invention

The present invention relates to a light emitting device, and more particularly, to a light emitting device having a semiconductor light emitting diode (LED) chip and a method of manufacturing the same.

2. Description of the Related Art

In general, a light emitting device having a light emitting diode (LED) chip is structured as a package with a case obtained by injection-molding a white resin together with a lead frame. In this light emitting device, an LED chip is mounted on a groove of the case to connect to the lead frame and then the groove is filled with a resin. Particularly, to manufacture a white light emitting device, a phosphor powder may be added to the resin filled in the groove.

However, a conventional light emitting device entails drawbacks in terms of miniaturization and yield.

For example, a side view light emitting device, which is mainly used as a backlight source of a display of a mobile phone and can be surface mounted, greatly needs to be thinned in line with a thinner trend of the mobile phone. However, the conventional light emitting device should be provided with a groove for mounting LED chip therein, thus posing difficulty to the manufacture of a sufficiently smaller case having the LED chip thereon.

Besides, the conventional light emitting device is manufactured through a complicated process. That is, the case is injection-molded, with the lead frame disposed, the LED chip is mounted and a resin encapsulant is formed in the groove. This undermines yield and increases manufacturing costs.

Notably, in a white light emitting device, when a liquid resin containing a phosphor powder is dispensed, the phosphor may be injected unevenly due to the dispensing process.

SUMMARY OF THE INVENTION

An aspect of the present invention provides a method of manufacturing a smaller light emitting device in which a light emitting diode (LED) chip and an electrode lead for external connection can be integrated through a single process unlike a conventional package process.

An aspect of the present invention also provides a novel light emitting device which can be manufactured in a smaller size and through a simpler process.

According to an aspect of the present invention, there is provided a method of manufacturing a light emitting device, the method including: providing a plurality of LED chips each having an electrode surface where both electrodes are formed, and a plurality of external terminal blocks, each of the external terminal blocks having an electrical contact part exposed on at least one surface; attaching the external terminal blocks and the LED chips on a first sheet such that the electrode surface and an exposed surface of the electrical contact part are located at a top and each of the LED chips is disposed between the external terminal blocks; connecting the electrodes of the LED chip to exposed surfaces of the electrical contact parts of adjacent ones of the external terminal blocks by wires, respectively; forming a chip array structure by attaching a spacer having a height greater than a height of the wires on the first sheet to surround an arrangement area of the external terminal blocks and the LED chips; disposing the chip array structure inside a chamber and decompressing the chamber inside to be in one of a low pressure and vacuum state; dropping a curable liquid resin to be filled in the arrangement area surrounded by the spacer; attaching a second sheet on the spacer when the curable liquid resin is filled inside the chip array structure; curing the curable liquid resin filled inside the chip array structure; and cutting the chip array structure into a desired size to obtain a plurality of light emitting devices.

According to another aspect of the present invention, there is provided a method of manufacturing a light emitting device, the method including: providing a plurality of LED chips each having an electrode surface where both electrodes are formed, and a plurality of external terminal blocks, each of the external terminal blocks having an electrical contact part exposed on at least one surface; attaching the external terminal blocks and the LED chips on a first sheet such that the electrode surface and an exposed surface of the electrical contact part are located at a top and each of the LED chips is disposed between the external terminal blocks; connecting the electrodes of the LED chip to exposed surfaces of the electrical contact parts of adjacent ones of the external terminal blocks by wires, respectively; attaching a spacer on the first sheet to surround an arrangement area of the external terminal blocks and the LED chips, the spacer having a height greater than a height of the wires and having at least one inlet formed therein; attaching a second sheet on the spacer to produce a chip array structure having an inner space including the arrangement area; disposing the chip array structure inside a chamber and decompressing the chamber inside to allow the inner space of the chip array structure to be in one of a low pressure and vacuum state; disposing a curable liquid resin in an area adjacent to the inlet of the spacer to seal the inner space thereof while the chamber is decompressed; reverting the one of the low pressure and vacuum state of the chamber back to an original state to allow the curable liquid resin to be filled in the inner space of the spacer through the inlet; curing the curable liquid resin filled inside the chip array structure; and cutting the chip array structure into a desired size to obtain a plurality of light emitting devices.

Each of the LED chips may include a transparent resin layer formed on at least one side surface thereof. The each of the LED chips may include transparent resin layers formed on the side surface and a surface opposing the electrode surface, respectively. A corresponding one of the transparent layers formed on the surface opposing the electrode surface may include a phosphor powder.

Before the chip array structure is diced into a desired size, a phosphor layer may be additionally formed on at least an area of the LED chip out of the exposed surface after removing the first sheet.

The method may further include removing the first and second sheets, between the curing the curable liquid resin and the cutting the chip array structure into a desired size.

The each of the external terminal blocks may include an insulating block having first and second surfaces opposing each other, the electrical contact part of the external terminal block may include a conductive via hole extending through the first and second surfaces of the insulating block, and the exposed surface of the electrical contact part may be the first surface of the insulating block.

To ensure wires to be connected in a sufficient area, the electrical contact part of the external terminal block may further include an electrode layer formed on the first surface of the insulating block to connect to the conductive via hole.

The insulating block may be a ceramic block or a printed circuit board (PCB) block. The insulating block, when formed of the ceramic block, may have a porous structure to be more strongly bonded to the resin.

The each of the external terminal blocks may have a side surface where at least one step is formed to be more superbly bonded to the light emitting device.

The cutting the chip array structure may include cutting the chip array structure together with the external terminal blocks so as to expose the conductive via hole.

The providing a plurality of LED chips and a plurality of external terminal blocks may include arranging the plurality of LED chips and the plurality of external terminal blocks in such a way that four of the LED chips share one of the external terminal blocks, and the cutting the chip array structure may include cutting the chip array structure together with the external terminal blocks in such a way that the conductive via hole is exposed at two side surfaces of adjacent ones of the insulating blocks, respectively.

The attaching the external terminal blocks and the LED chips on a first sheet may include: arranging the LED chips and the external terminal blocks on the first sheet having a curable material applied thereon; and curing the curable material such that the LED chips and the external terminal blocks are secured to each other on the first sheet.

The method may further include disposing the curable liquid resin inside the chamber, before the decompressing the chamber inside, whereby the curable liquid resin is de-aired in the decompressing the chamber inside.

The curable resin may include an electrically insulating high-reflectivity powder. The high-reflectivity powder may be a $TiO_2$ powder.

The method may further include: attaching a zenor diode on one of the external terminal block and the LED chip, after the attaching the external terminal blocks and the LED chips, wherein the connecting the electrodes by wires includes connecting the zenor diode, the electrical contact part of the external terminal block and the electrodes of the LED chip to one another by wires.

The method may further include attaching a heat radiator on the LED chip, after attaching the external terminal blocks and the LED chips.

The second sheet may be rigid. The external terminal block may have a height identical to a height of the spacer, the external terminal block may have a step formed on a surface facing the LED chip and may have a step surface electrically connected to a top end thereof.

The external terminal block may be formed of a conductor capable of serving as the electrical contact part.

According to still another aspect of the present invention, there is provided a light emitting device including: a package body having a first circumferential surface, a second circumferential surface and a plurality of side surfaces formed therebetween, the package body defined into first and second level areas including the first and second circumferential surfaces, respectively, and formed of a curable resin; first and second external terminal blocks disposed at both edges of the package body, respectively and each having first and second surfaces and side surfaces therebetween, each of the first and second external terminal blocks having the first surface exposed to the first circumferential surface of the package body and having an electrical contact part connected from inside of the package body to another exposed surface; an LED chip disposed between the first and second external terminal blocks in the first level area and having an electrode surface where first and second electrodes are formed, the electrode surface facing the second level area; and wires electrically connected to first and second electrodes of the LED chip to the electrical contact parts of the first and second external terminal blocks, respectively.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings.

A method of manufacturing a light emitting device according to a first embodiment of the present invention will be more easily understood by way of exemplary processes shown in FIGS. 1 and 2.

FIGS. 1A to 1D illustrate processes of manufacturing a chip array structure necessary for manufacturing a light emitting device according to a first embodiment of the invention.

Figure 1A:
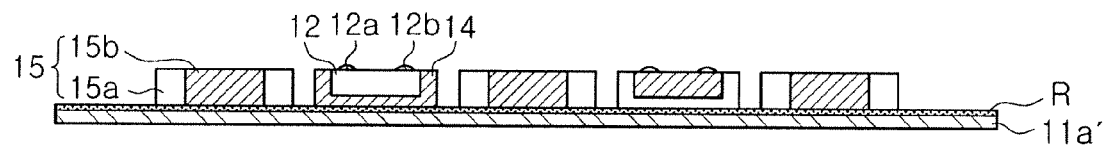
FIGS. 1A to 1D are cross-sectional views illustrating a manufacturing process of a chip array structure in a method of manufacturing a light emitting device according to a first embodiment of the invention.

As shown in FIG. 1A, external terminal blocks 15 and light emitting diode (LED) chips 12 are arranged on a first sheet 11a' having a curable material R applied thereon.

Each of the LED chips 12 has electrodes 12a and 12b of opposite polarities formed on one surface (hereinafter, "electrode surface"). As in the present embodiment, resin layers 14 may be formed on a surface opposing the electrode surface and side surfaces of each of the external terminal blocks 15. The resin layers 14 may contain a phosphor powder for converting wavelength. Particularly, a phosphor-containing portion of the resin layers may be provided on a surface serving as a light exiting surface in the LED chip 12, i.e., the surface opposite to the electrode surface.

The external terminal block 15 of the present embodiment includes an insulating block 15a and an electrical contact part 15b extending through both surfaces of the external terminal block and formed of a conductor. The electrical contact part 15b is exposed on at least one surface of the external terminal block 15 to be brought in contact with the LED chip 12. This external terminal block 15 is provided as an external terminal of a final light emitting device. A connection area for this external terminal can be attained by exposing the electrical contact part 15b through a diced surface when diced in a later dicing process.

Figure 7A:
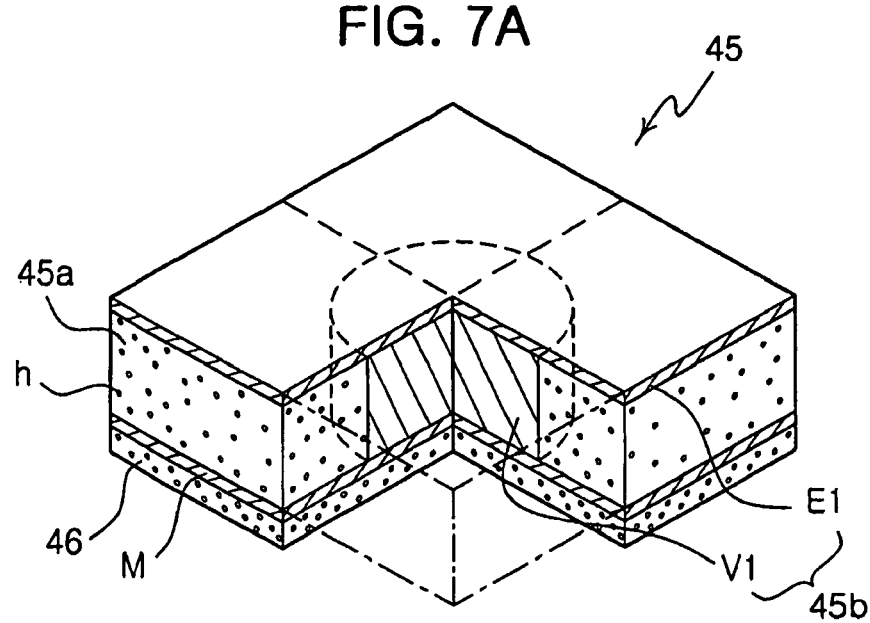
FIGS. 7A and 7B are perspective views illustrating an external terminal block applicable to the first embodiment of the present invention.
Figure 7B:
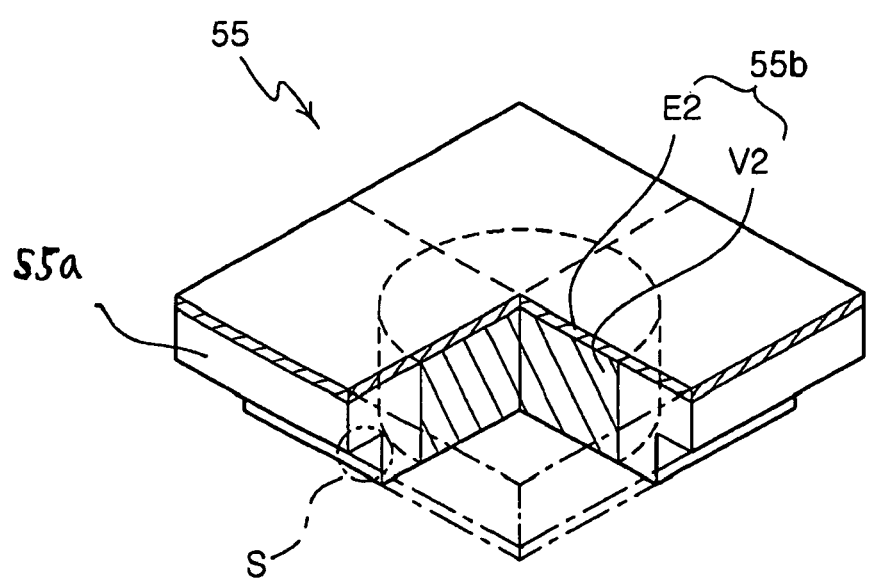
Figure 16:
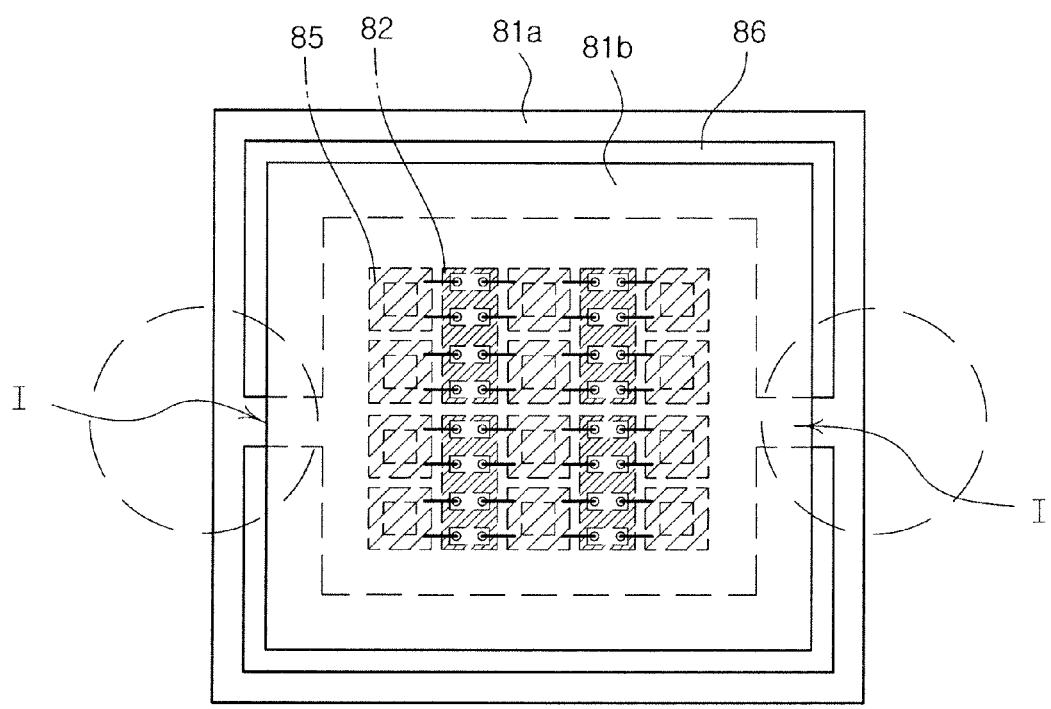
FIG. 16 is a plan view illustrating an arrangement shown in FIG. 13D, seen from top.

The shape of the external terminal block 15, and position and shape of the electrical contact part 15b may be varied according to a structure of a desired final light emitting device, e.g., side view or top view light emitting device (see FIGS. 7A, 7B and FIG. 16).

The external terminal block 15 applicable to the present embodiment is not limited to a specific shape as long as provided with the electrical contact part 15b exposed to connect to the electrodes 12a and 12b of the LED chip and exposed on a surface of the final light emitting device, i.e., after dicing. In a specific embodiment, the external terminal block may be formed of a conductor material to serve as the electrical contact part.

Figure 3:
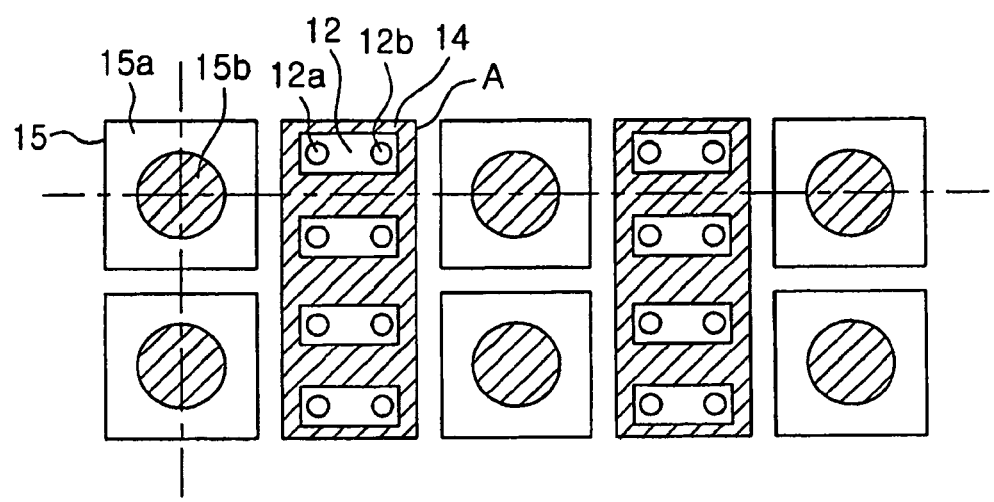
FIG. 3 is a plan view illustrating arrangement of FIG. 1A, seen from top.

In the present embodiment, the LED chip 12 is disposed between the external terminal blocks 15. To be connected by wires later, the LED chip 12 and the external terminal block 15 are arranged such that the electrode surface and an exposed surface of the electrical contact part 15b are located at a top. FIG. 3 illustrates arrangement applicable to an exemplary embodiment of the invention.

Referring to FIG. 3, an LED chip 12 is illustrated as LED chip arrays A arranged in a line. Each of these LED chip arrays A is construed as a structure where a resin layer 14 formed has not been diced into individual chips. Of course, alternatively, individual chips may be arranged in place of adopting the LED chip array.

In the arrangement, four LED chips 12 share one external terminal block 15. Therefore, when diced along dotted lines in a following process, the external terminal block 15 is diced into quarters to produce four individual light emitting devices. Here, when the external terminal block 15 is diced into quarters, a conductive via hole, i.e., the electrical contact part 15b is diced at the same time, thereby exposing the electrical contact part 15b at two adjacent side surfaces formed by the dicing. The exposed surfaces of the electrical contact part can serve as a connection area for the external terminal block 15. The external terminal of the light emitting device can be configured without being limited to the above. In alternative arrangement, two or other number of LED chips may share one external terminal block.

Figure 1B:
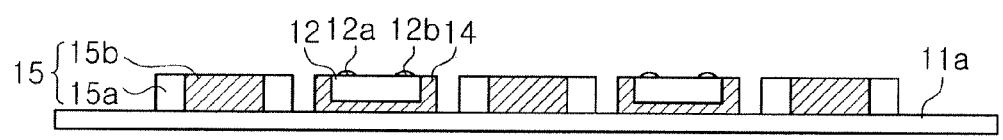

Thereafter, as shown in FIG. 1B, the LED chip 12 and the external terminal block 15 arranged on the first sheet 11a' are fixed to the first sheet 11a using an adhesive curable material R.

To perform this process, the LED chips 12 and the external terminal blocks 15 may be pressed adequately and then an adhesive curable material may be cured appropriately. For example, in a case where a curable material is an ultra violet (UV) curable resin, the ultra violet may be irradiated to attach the LED chips 12 and the external terminal blocks 15 on the first sheet 11a after performing pressing.

Figure 1C:
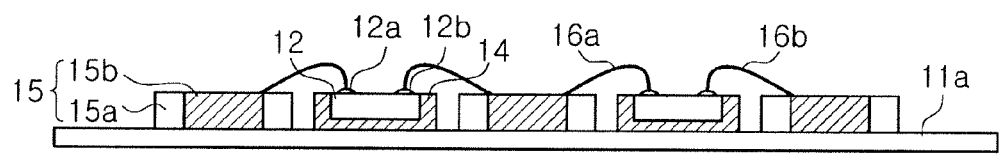

Then, as shown in FIG. 1C, the electrodes 12a and 12b of the LED chip 12 are connected to the exposed surfaces of the electrical contact parts 15b of adjacent ones of the external terminal blocks 15 by wires, respectively.

In the arrangement process described above (see FIG. 1A), the LED chip 12 and the external terminal block 15 are arranged such that the electrode surface and the exposed surface of the electrical contact part 15b are provided on a top. Thus this wire-bonding process can be performed easily.

Figure 1D:
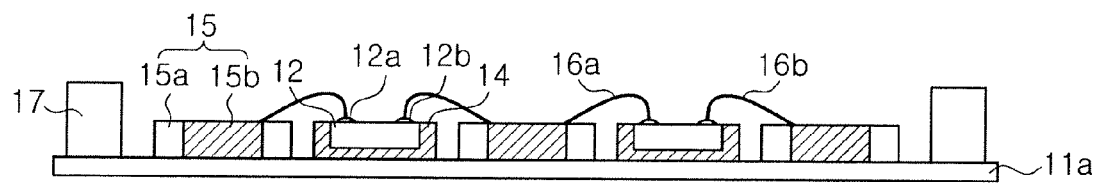

Next, as shown in FIG. 1D, a spacer 17 is attached on the first sheet 11a to surround an arrangement area defined by the external terminal blocks 15 and the LED chips 12.

The spacer 17 defines an area where the resin is filled in a following process of filling the resin. Therefore, to ensure the wires 16a and 16b to be positioned inside a package body formed of the resin, the spacer 17 has a height greater than a height of the wires 16A and 16B. The spacer 17 can be attached using an adhesive resin or a curable material.

These processes allow for a chip array structure applicable to the first embodiment of the present invention. The chip array structure shown in FIG. 1D can be manufactured into a plurality of light emitting devices through a series of processes such as filling of resin and dicing as shown in FIGS. 2A to 2D.

Figure 2A:
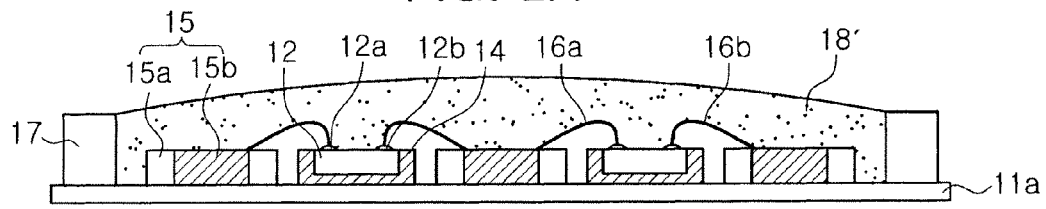
FIGS. 2A to 2D are cross-sectional views illustrating a manufacturing process of an individual light emitting device in a method of manufacturing a light emitting device according to a first embodiment of the invention.

First, as shown in FIG. 2A, a curable liquid resin 18' is dropped onto the arrangement area inside the spacer 17 to fill the arrangement area surrounded by the spacer 17.

The curable liquid resin 18' may be dropped in a sufficient amount to fill an inner space of the spacer. More specifically, the curable liquid resin 18' may be dropped to at least a height of the spacer 17.

The curable liquid resin 18' may be a transparent resin containing an electrically insulating and high-reflectivity powder to prevent loss from light absorption by other components and enhance light radiation efficiency. The high-reflectivity powder may be a $TiO_2$ powder. The transparent resin may adopt a silicon resin, an epoxy resin and a combination thereof.

The dropped resin 18' can be adequately positioned between the LED chips 12 and the external terminal blocks 15 by adjusting conditions such as viscosity of the resin.

In the present embodiment, to fill the resin, the chip array structure is disposed in a vacuum chamber and the chamber is decompressed to be in a low pressure or vacuum state. For example, this process can be performed in a vacuum chamber shown in FIGS. 4A and 4B.

Figure 4A:
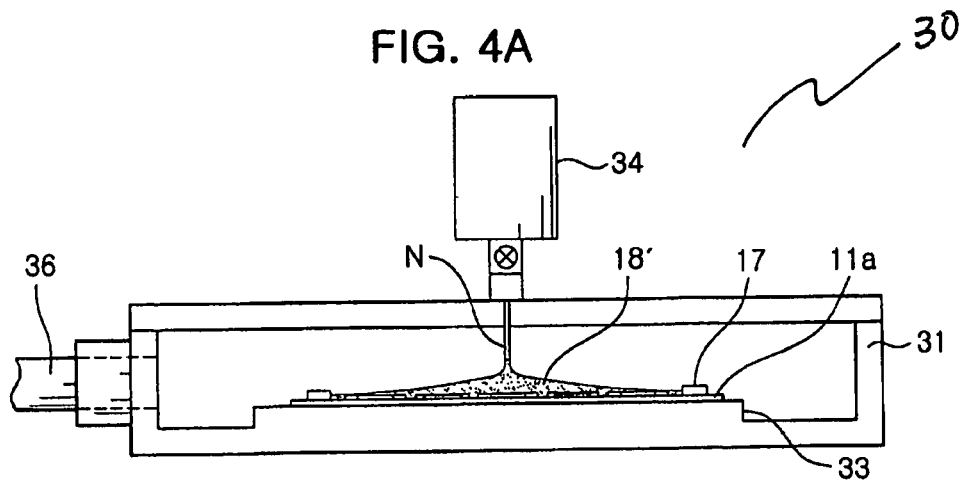
FIG. 4A is side cross-sectional view and 4B is an internal plan view illustrating a vacuum chamber applicable to the present invention, respectively.
Figure 4B:
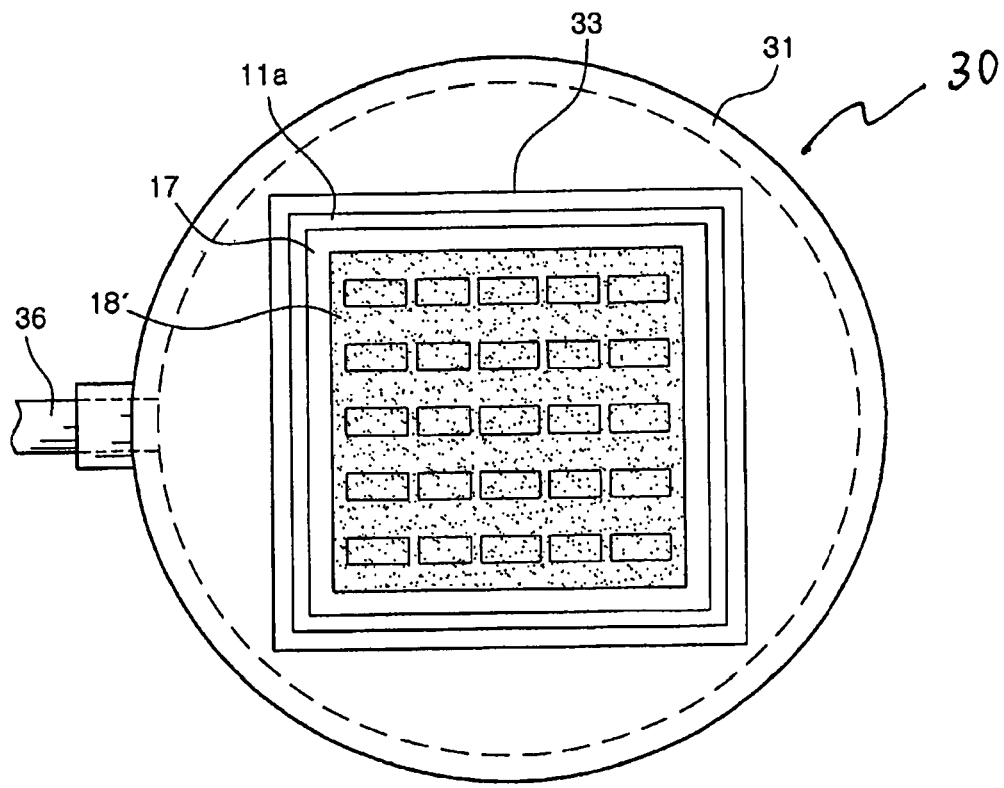

As shown in FIGS. 4A and 4B, a vacuum chamber apparatus 30 includes a chamber 31, a vacuum valve 36 provided at one side of the chamber 31 and a shelf 33 provided inside the chamber 31.

The chamber 31 has an inner space decompressed through a vacuum valve 36 to be in a vacuum or low pressure state. The chamber 31 may additionally include a resin storage 34 to drop the curable liquid resin 18' onto a desired location. The resin storage 34 assures de-airing of the curable resin 18', which is to be filled under this decompression condition.

Before decompressing the inside of the chamber 31, the curable liquid resin may be previously positioned inside the chamber 31 to be more effectively de-aired.

Figure 2B:
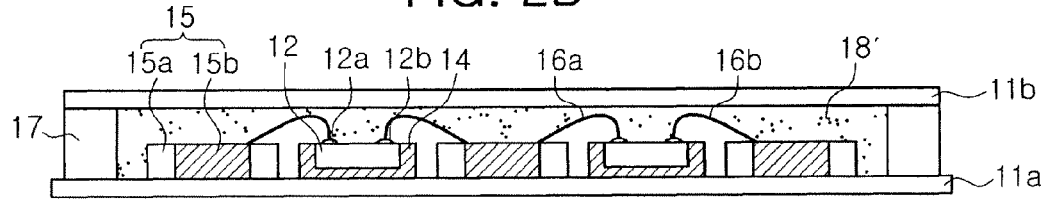

Thereafter, as shown in FIG. 2B, the chamber 31 is reverted to its original state and then a second sheet 11b is attached onto the spacer 17.

When the second sheet 11b is attached on the spacer 17, the curable liquid resin 18' can be adjusted in level to be equivalent to a height of the spacer 17. Moreover, an appropriate pressure may be applied when the second sheet 11b is attached, thereby allowing the curable liquid resin 18' to be injected into an area between the LED chips 12 and external terminal blocks 15 more effectively. This process along with other following processes may be carried out while the chip array structure is unloaded after the chamber is reverted to its originals state.

Figure 2C:
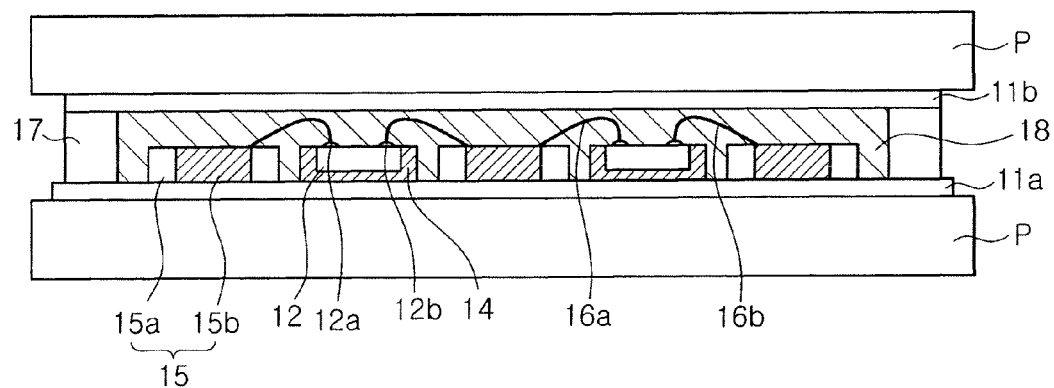

Thereafter, as shown in FIG. 2C, the curable liquid resin 18' filled inside the chip array structure is cured.

The curing can be performed by using heat or ultraviolet ray irradiation depending on type of the resin. In this process, the curing may be directly performed inside the chamber 31. Alternatively, the chip array structure may be picked up and cured using an additional pressing apparatus P outside. The cured resin 18 secures the LED chips 12 and the external terminal blocks 15 together to form a single structure. Also, the cured resin may protect the wires 16 electrically connecting the chips 12 and the blocks 15.

Figure 2D:
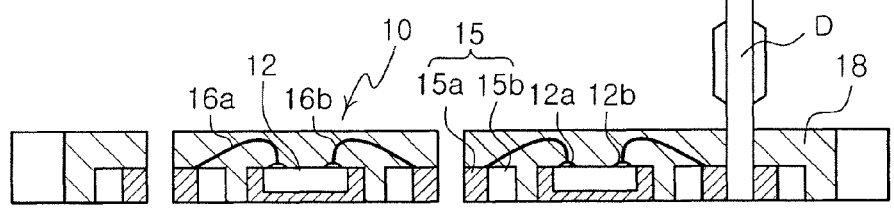

Subsequently, as shown in FIG. 2D, the first and second sheets 11a and 11b are removed from the chip array structure, and the chip array structure is diced into a desired size to produce a plurality of light emitting devices 10.

The first and second sheets 11a and 11b can be removed from the chip array structure by a suitable chemical and mechanical method known in the art. After the sheets 11a and 11b are removed, the chip array structure is diced by a dicing apparatus D.

In the arrangement of FIG. 1A and FIG. 3, the chip array structure is diced into quarters so that the divided external terminal blocks 15 serve as external terminals for four light emitting devices, respectively. Also, the chip array structure may be diced in such a way that the electrical contact part 15b is exposed at two adjacent side surfaces through a diced surface of the external terminal blocks 15.

Figure 5A:
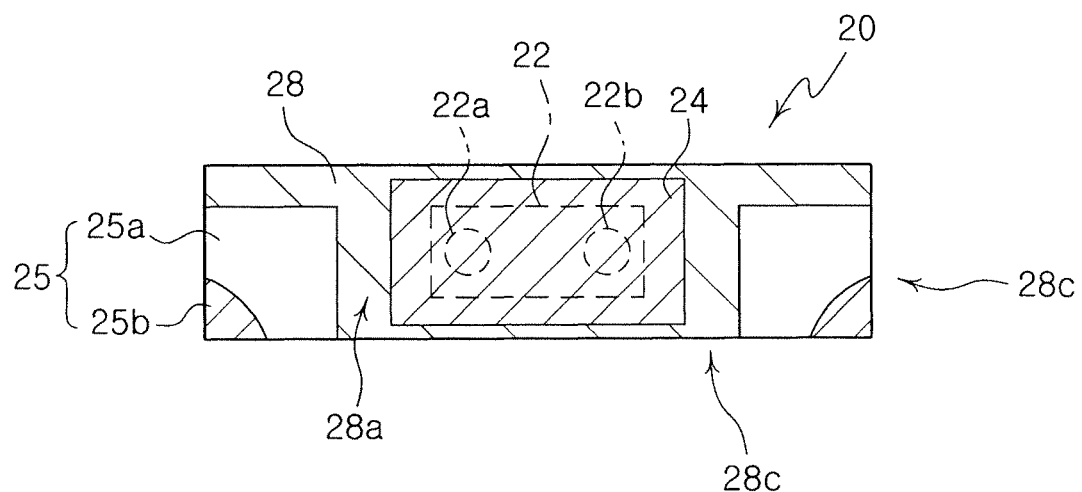
FIG. 5A is a plan view and FIG. 5B is a side cross-sectional view illustrating a light emitting device, respectively according to the present invention.
Figure 5B:
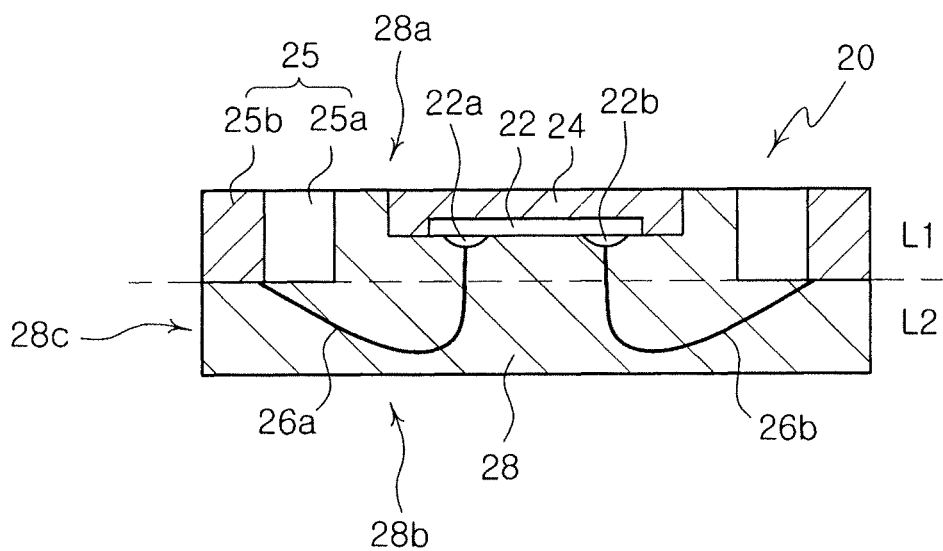

FIG. 5A is a plan view and FIG. 5B is a side cross-sectional view illustrating a light emitting device, respectively according to a first embodiment of the present invention.

Referring to FIGS. 5A and 5B, the light emitting device 20 includes a package body 28 formed of a curable resin. The package body 28 has first and second circumferential surfaces 28a and 28b opposing each other and a side surface 28c disposed therebetween. The first and second circumferential surfaces 28a and 28b and the side surface 28c of the package body 28 are planar. In the present embodiment, each of the surfaces of the package body is planar but may be varied through additional machining.

The package body 28 may be a transparent resin containing an electrically insulating and high-reflectivity powder to reduce loss from light absorption by other components. The high-reflectivity powder may adopt a $TiO_2$ powder.

First and second external terminal blocks 25 are disposed at both edges of the package body 28. Each of the first and second external terminal blocks 25 includes a first surface exposed to the first circumferential surface 28a of the package body 28 and a second surface opposing the first surface. The external terminal block 25 of the present embodiment includes an insulating block 25a and an electrical contact part 25b extending through the first and second surfaces.

To explain the structure of the light emitting device 20 of the present invention more easily, the package body 28 is construed to be divided into first and second level areas L1 and L2 including the first and second circumferential surfaces 28a and 28b, respectively based on an electrode surface of the LED chip 22 where the electrodes 22A and 22B are formed.

The LED chip 22 is located between the first and second external terminal blocks 25 in the first level area L1 and the electrode surface where the first and second electrodes 22a and 22b are formed faces the second level area L2. The LED chip 22 can be connected to a portion of the connector 25b exposed to the second surface of each of the first and second external terminal blocks 25 by wires 26a and 26b. Also, the wires 26 can be located in the second level area L2 and across a portion L1 of the first level area of the package body 28 to be protected.

In the present embodiment, as described regarding the arrangement shown in FIG. 3 and the dicing process of FIG. 2D, the each external terminal block 25 may be diced into quarters so that the electrical contact part 25b is exposed at two adjacent diced surfaces. Here, a side surface of the package body 28 where the electrical contact part 25b of the external terminal block 25 is exposed serves as an area where the light emitting device 20 is mounted. The light emitting device 20 with this structure can be very effectively utilized as a side view LED package.

Particularly, the light emitting device 20 of the present embodiment does not employ an additional case structure, thereby realizing sufficient compactness. Moreover, unlike a conventional method entailing an additional process of forming a resin encapsulant aside from a process of injection-molding the case structure, the whole structure can be manufactured in a single process and does not require additional machining for a lead frame. This advantageously allows compact packages to be mass-produced.

The light emitting device of the present embodiment may be varied depending on a desired package structure. For example, a necessary component can be adequately added. As a representative example, the light emitting device may include a heat radiator for radiating heat effectively and/or a zenor diode for voltage resistance characteristics.

Figure 6A:
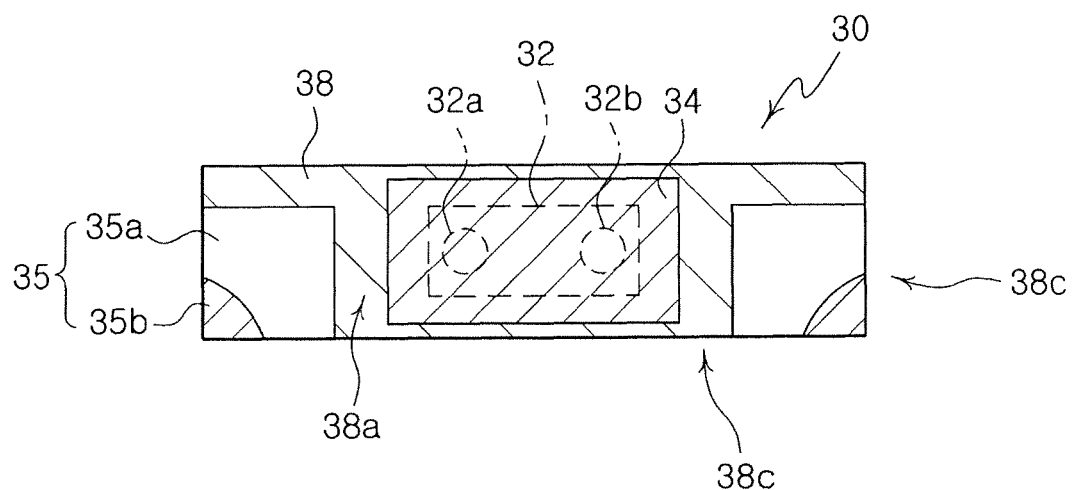
FIG. 6A is a plan view and FIG. 6B is a side cross-sectional view illustrating a light emitting device, respectively according to the present invention.
Figure 6B:
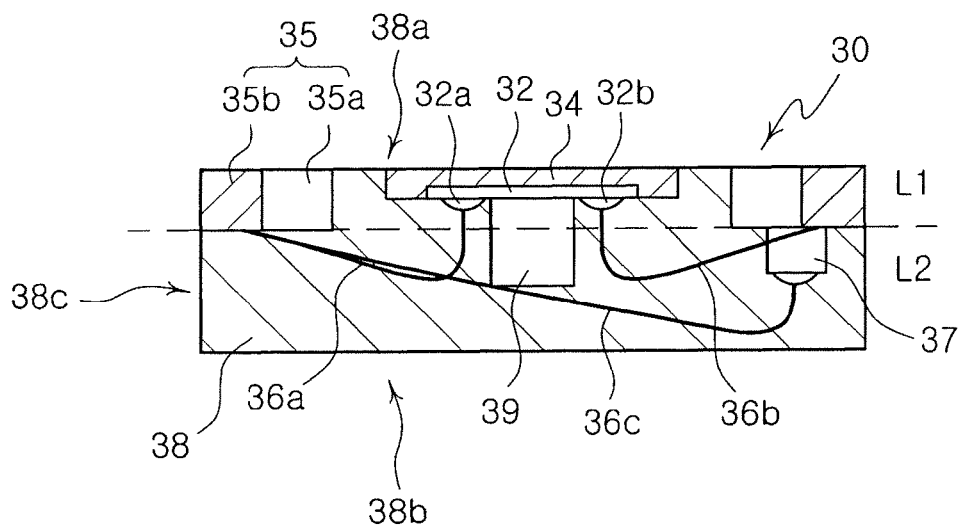

FIG. 6A is a plan view and FIG. 6B is a side cross-sectional view illustrating a light emitting device, respectively according to another exemplary embodiment of the present invention.

Referring to FIG. 6A and FIG. 6B, in a similar manner to the light emitting device 20 shown in FIGS. 5A and 5B, the light emitting device 30 includes a package body 38 and first and second external terminal blocks 35 disposed at both edges of the package body 38. The light emitting device 30 also includes an LED chip 32 disposed between the first and second external terminal blocks.

The LED chip 32 is located in a first level area L1, and first and second electrodes 32a and 32b may be connected to an electrical contact part 35b of each of the first and second external terminal blocks 35 by wires 36a and 36b, respectively. Furthermore, the wires 36a and 36b can be located in a second level area L2 of the package body 38 to be protected.

The light emitting device 30 of the present embodiment includes a zenor diode 37 disposed on one of the external terminal blocks 35 in the second level area L2. The zenor diode 37 can be electrically connected to the LED chip 32 by wire-bonding or surface mount technology. That is, as in the present embodiment, the zenor diode 37 has one electrode connected to the electrical contact part 35b of one of the external terminal blocks 35 by surface mount technology. Also, the zenor diode 37 has another electrode connected to the electrical contact part 35b of the other external terminal block 35 by wires 36c.

Alternatively, the zenor diode 37 may be bonded with different configurations depending on location of the electrodes and mounting position thereof. For example, alternatively, the zenor diode 37 may be mounted on an electrode surface of the LED chip 32. Here, the zenor diode 37 may have both electrodes connected to the electrical contact part by wires, respectively.

In addition, the light emitting device 30 may further include a heat radiator 39 located in the second level area L2 and attached on the LED chip 32. The heat radiator 39 may be formed of a known material having excellent thermal conductivity.

As described above, optionally, the light emitting device 30 may include the zenor diode 37 and/or the heat radiator 39. This process can be performed by a manufacturing process of the chip array structure shown in FIGS. 1A to 1D. Such a process may be performed before the wires bonding process (FIG. 1C).

FIGS. 7A and 7B are perspective views illustrating an external terminal block applicable to the first embodiment of the present invention. Here, the external terminal block is applicable to the arrangement of FIG. 3 and a final light emitting device may be divided into quarters along dotted lines. Alternatively, the external terminal block may be configured as a board shown in FIG. 9.

An external terminal block 45 of FIG. 7A includes an insulating block 45a. This insulating block 45a may be formed of a ceramic body. Notably, the ceramic body may be formed of a porous structure having a plurality of pores h to be more highly bonded to a resin of the package body. To this end, the insulating block 45a of the porous structure may have a porosity of about 10 to 60% and a pore diameter of about 0.1 to 1.3 μm.

An electrical contact part 45B of the external terminal block 45 may include a conductive via hole V1 extending through both surfaces of the insulating block 45 and an electrode layer E1 connected to the conductive via hole V1. Here, the electrode layer E1 allows electrodes of the LED chip to be wire-bonded thereto in a greater bonding area, thereby diminishing defects associated with bonding.

When the conductive via hole V1 is formed, optionally, a metal layer M made of Au or Ag may be formed on the external terminal block 45. This metal layer M absorbs light generated from the LED chip inside the package structure, potentially degrading optical efficiency. To prevent this, the external terminal block 45 may further include a light absorption prevention layer 46 to at least cover the metal layer M. The light absorption prevention layer 46 may be formed of a resin layer containing a high-reflectivity powder such as $TiO_2$.

An external terminal block 55 shown in FIG. 7B includes an insulating block 55a. This insulating block 55a has a step S provided at a side surface of the external terminal block 55. In a similar manner to the porous structure described above, this step S structure can be more highly bonded to the resin of the package body.

The electrical contact part 55b of the external terminal block 55 may include a via hole V2 extending through both surfaces of the insulating block 55 and an electrode layer E2 connected to the conductive via hole V2. Here, the electrode layer E2 ensures electrodes of the LED chip to be wires-bonded thereto in a greater bonding area, thereby diminishing defects associated with bonding.

FIGS. 8A to 8D are cross-sectional views illustrating a manufacturing process of a chip array structure in a method of manufacturing a light emitting device according to a modified example of the first embodiment of the invention.

Figure 8A:
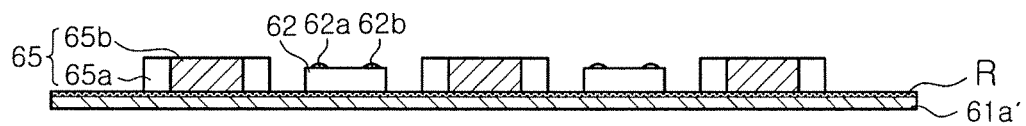
FIGS. 8A to 8D are cross-sectional views illustrating a manufacturing process of a chip array structure in a method of manufacturing a light emitting device according to a modified example of the first embodiment of the invention.

As shown in FIG. 8A, external terminal blocks 65 and LED chips 62 are arranged on a first sheet 61a' having a curable material R applied thereon.

Each of the LED chips 62 is provided with an electrode surface where electrodes 62a and 62b of opposite polarities are formed. In the present embodiment, unlike the embodiment of FIG. 1, a resin layer is not additionally formed on a surface of the LED chip 62.

Similarly to FIG. 1, each of the external terminal block 65 may include an insulating block 65a, and an electrical contact part 65b extending through both surfaces of the external terminal block and formed of a conductor. The external terminal block is diced in a later dicing process (see FIG. 2E) and the electrical contact part 65b may be exposed at a diced surface to ensure a connection area for the external terminal block.

In the present embodiment, the LED chip 62 is disposed between the external terminal blocks 15. The LED chip 62 and the external terminal block 65 are arranged such that the electrode surface and an exposed surface of the electrical contact part 65b are located at a top.

Figure 9:
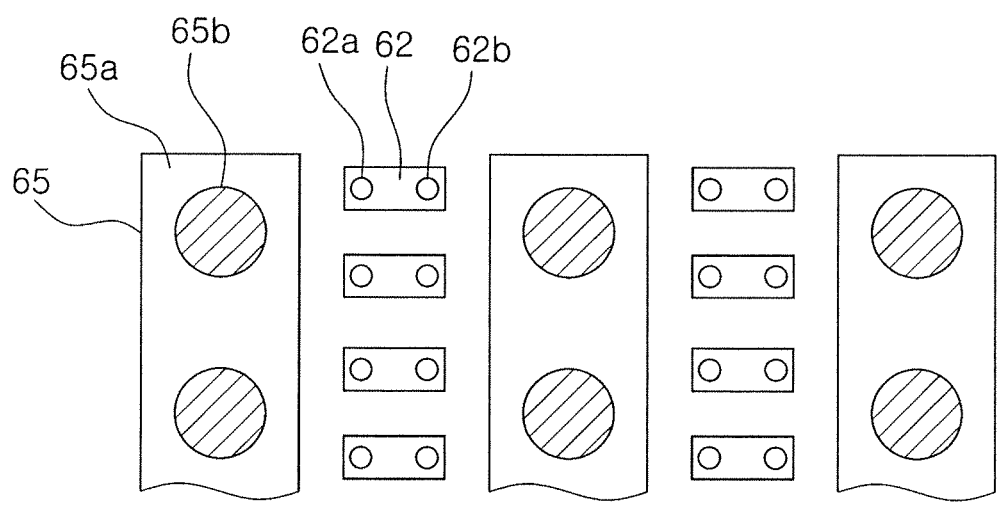
FIG. 9 is a plan view illustrating an arrangement shown in FIG. 8A, seen from top.

In the arrangement of the present embodiment, as shown in FIG. 9, an external terminal block 65 is configured as a board. This external terminal block 65 can be easily manufactured by adopting a printed circuit board (PCB). Also, when diced along dotted lines in a later process, an electrical contact part 65b of the external terminal block 65 is diced into quarters to act as four respective light emitting devices. Here, the electric contact part 65b may be exposed on two adjacent side surfaces formed by the dicing to ensure a connection area for external terminals. The external terminals for the light emitting devices may be formed by the method described above but not limited thereto. In alternative arrangement, two or other number of LED chips may share the external terminal block.

Figure 8B:
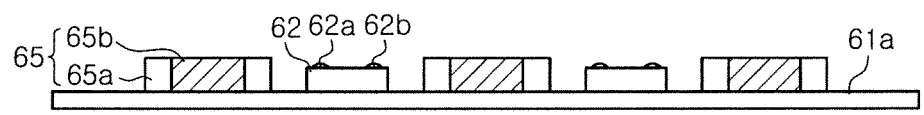

Thereafter, as shown in FIG. 8B, the LED chip 62 and the external terminal block 65 arranged are attached on the first sheet 61a using an adhesive curable material R.

The LED chips 62 and the external terminal blocks 65 can be attached on the first sheet 61a after appropriately pressing the LED chips 62 and the blocks 65 and performing curing with the adhesive curable material.

Figure 8C:
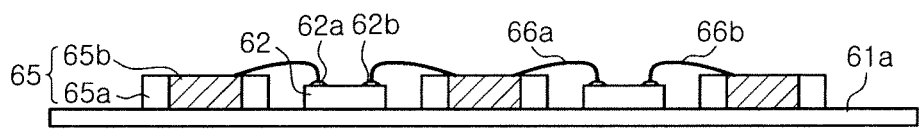

Next, as shown in FIG. 8C, the electrodes 62a and 62b of the LED chip 62 are connected to exposed surfaces of the electrical contact parts of adjacent ones of the external terminal blocks 65 by wires, respectively.

Figure 8D:
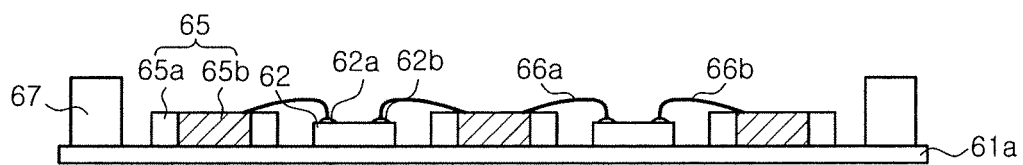

Afterwards, as shown in FIG. 8D, a spacer 67 is attached on the first sheet 61a to surround an arrangement area of the external terminal blocks 65 and the LED chips 62.

To ensure the wires 66A and 66B to be positioned inside a package body formed of the resin, the spacer 67 has a height greater than a height of the wires 66a and 66b. The spacer 67 can be attached using an adhesive resin or a curable material.

These processes allow for a chip array structure applicable to the present embodiment. The chip array structure shown in FIG. 8D can be manufactured into a plurality of light emitting devices through a series of processes such as filling of resin and dicing as shown in FIGS. 9A to 9E.

Unlike the embodiment of FIG. 1, the LED chip 62 of the present embodiment does not include a resin layer formed on a surface thereof. The light emitting device may require formation of a phosphor layer for converting wavelength. Therefore, the present embodiment suggests a novel process of forming a phosphor layer. This process can be understood by way of processes shown in FIGS. 10A to 10E.

Figure 10A:
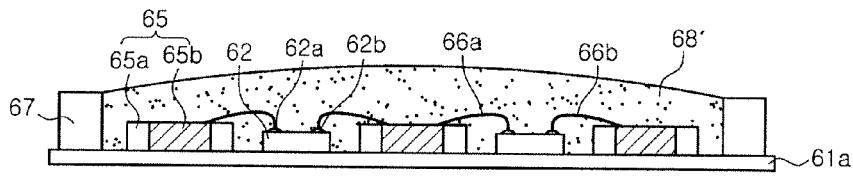
FIGS. 10A to 10E are cross-sectional views illustrating a manufacturing process of an individual light emitting device in a method of manufacturing a light emitting device according to a modified example of the first embodiment of the invention.

First, as shown in FIG. 10A, a curable liquid resin 68' is dropped onto an arrangement area inside a spacer 67 to be filled in the arrangement area surrounded by the spacer 67.

The curable liquid resin 68' may be dropped in a sufficient amount to fill an inner space of the spacer. Particularly, the curable liquid resin 68' may be dropped to at least a height of the spacer 67.

In the present embodiment, to fill the resin, a chip array structure is disposed in a vacuum chamber and the chamber is decompressed to be in a low pressure or vacuum state. For example, in a similar manner to the embodiment shown in FIG. 1, this process can be performed using the vacuum chamber shown in FIG. 4A and FIG. 4B.

The curable liquid resin of the present embodiment may have low refractivity to prevent light form being guided into the package body and facilitate light extraction in a desired direction. The curable liquid resin may utilize a transparent liquid resin having a refractivity of about 1.5 or less.

Figure 10B:
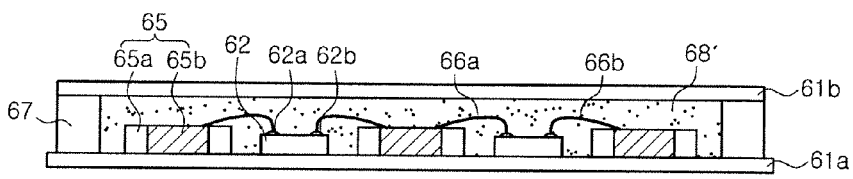

Thereafter, as shown in FIG. 10B, the chamber is reverted back to its original state and then a second sheet 61b is attached onto the spacer 67.

When the second sheet 61b is attached on the spacer 67, the curable liquid resin 68' can be adjusted in level to be equivalent to a height of the spacer 67. Moreover, an appropriate pressure may be applied when the second sheet 61b is attached, thereby allowing the curable liquid resin 68' to be injected into an area between the LED chips 62 and external terminal blocks 65 more effectively. This process along with other following processes may be carried out while the chip array structure is unloaded after the chamber is reverted back to its original state.

Figure 10C:
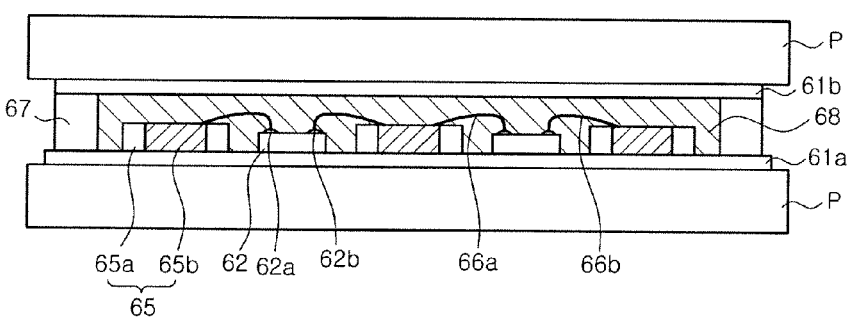

Next, as shown in FIG. 10C, the curable liquid resin 68' filled inside the chip array structure is cured.

The curing can be performed by using heat or irradiating ultraviolet ray depending on type of the resin. In this process, the curing may be directly performed inside the chamber. However, as in the present embodiment, the chip array structure may be picked up and cured using an additional pressing apparatus P outside. The cured resin 68 secures the LED chips 62 and the external terminal blocks 65 together to form a single structure. Also, the cured resin 68 can protect wires 66A and 66B electrically connecting the chip 62 to the block 65 to each other.

Figure 10D:
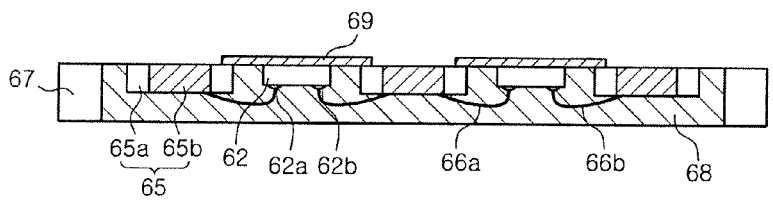

Subsequently, as shown in FIG. 10D, the first and second sheets 61a and 61b are removed from the chip array structure, and a phosphor layer 69 is formed on an exposed surface of the LED chip where the first sheet 61a is removed.

The first and second sheets 61a and 61b can be removed from the chip array structure by a suitable chemical and mechanical method known in the art. The phosphor layer 69 is formed on a light exiting surface, i.e., an area corresponding to at least the LED chip 62.

Figure 10E:
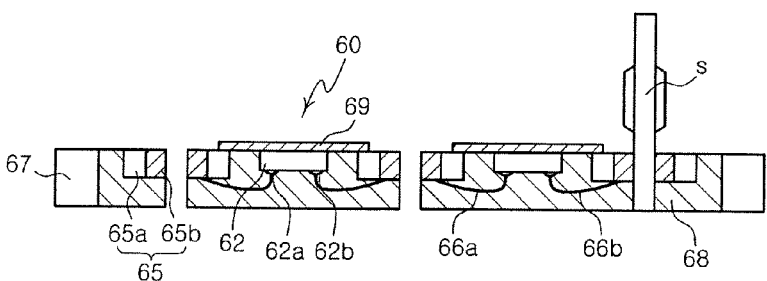

Thereafter, as shown in FIG. 10E, the chip array structure is diced into a plurality of light emitting devices 60.

The dicing can be performed by a suitable dicing apparatus. As in the present embodiment, when four LED chips 62 share one external terminal block 65, the external terminal block 65 is diced into quarters to act as respective light emitting devices 60. Here, a conductive via hole, which is the electrical contact part 65b, is diced together with the external terminal block 65 to expose the electrical contact part 65b at two adjacent side surfaces. The exposed surface of the electrical contact part may serve as an area for connecting the external terminal.

Figure 11A:
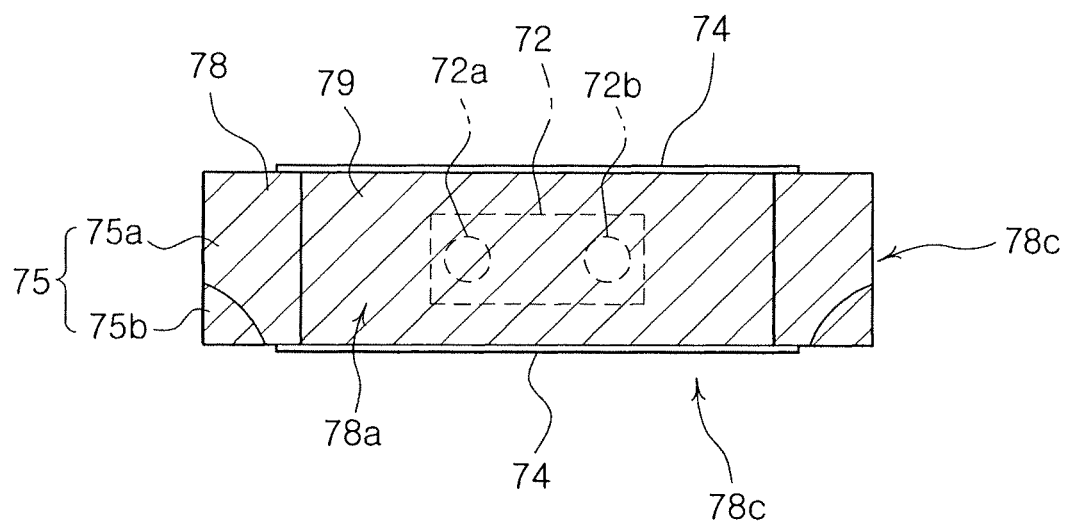
FIG. 11A is a plan view and FIG. 11B is a side cross-sectional view illustrating a light emitting device according to a first embodiment of the invention.
Figure 11B:
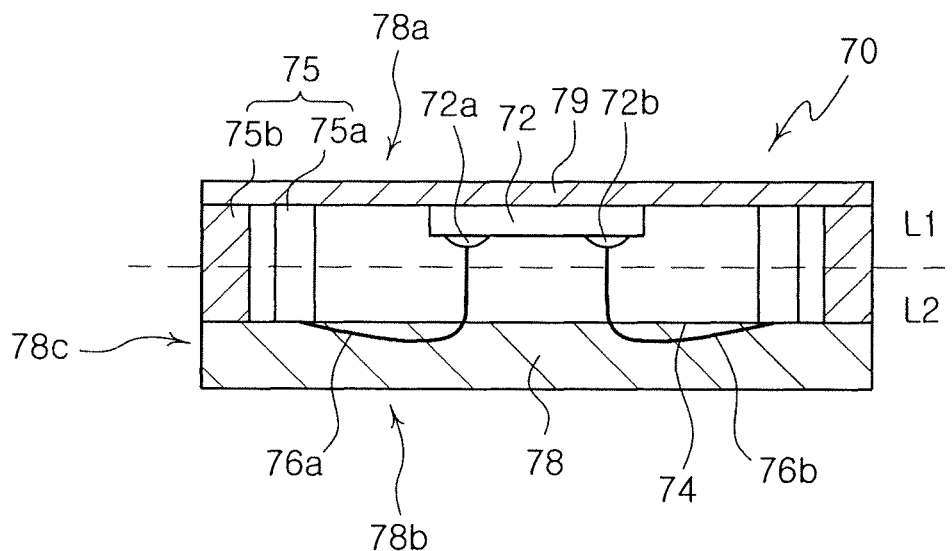

FIG. 11A is a plan view and FIG. 11B is a side cross-sectional view illustrating a light emitting device according to another exemplary embodiment of the invention.

Referring to FIGS. 11A and 11B, the light emitting device 70 includes a package body 78 formed of a curable resin. The package body 78 has first and second circumferential surfaces 78a and 78b opposing each other and a side surface 78c disposed therebetween. The first and second circumferential surfaces 78a and 78b and the side surface 78c of the package body 78 are planar.

First and second external terminal blocks 75 are disposed at both edges of the package body 78. Each of the first and second external terminal blocks 75 includes a first surface exposed to the first circumferential surface 78a of the package body 78 and a second surface opposing the first surface. The external terminal block 75 of the present embodiment includes an insulating block 75a and an electrical contact part 75b extending through the first and second surfaces.

The LED package body 78 is construed to be divided into first and second level areas L1 and L2 including the first and second circumferential surfaces 78a and 78b, respectively based on a surface of the LED chip 72 where the electrodes 72a and 72b are formed.

The LED chip 72 is located between the first and second external terminal blocks 75 in the first level area L1 and an electrode surface where the first and second electrodes 72a and 72b are formed faces the second level area L2. The LED chip 72 can be connected to a portion of the electrical contact part 75b exposed to the second surface of each of the first and second external terminal blocks 75 by wires 76a and 76b.

Also, the wires 76 can be positioned in the second level area L2 of the package body 78 to be protected. A surface of the LED chip 72 opposite to the electrode surface is exposed to the first circumferential surface 78a. The first circumferential surface 78a of the package body 78 is provided as a light exiting surface. A phosphor layer is provided on the first circumferential surface 78a of the package body to include at least the LED chip 72.

The curable resin of the package body 78 may have low refractivity to prevent light generated from the LED chip 72 from being guided into the package body 78 and facilitate extraction of light toward the phosphor layer 79. The curable resin may utilize a transparent resin having a refractivity of about 1.5 or less.

Furthermore, as shown in FIGS. 11A and 11B, the light emitting device 70 further includes side reflective layers 74 formed on two opposing side surfaces of the light emitting device 70 to at least cover an area where the LED chip 72 is positioned. The side reflective layers 74 are formed mainly on the side surfaces where the external terminal block is not disposed to thereby block light from propagating to a side of the package body 78. The side reflective layers 74 may be formed of a resin containing a high-reflectivity power such as TiO$_2$.

In the present embodiment, the external terminal block 75 is structured such that the electrical contact part 75b is exposed at two adjacent diced surfaces. Here, a side surface of the package body 78 where the electrical contact part 75b of the external terminal block 75 is exposed serves as an area where the light emitting device 70 is mounted. The light emitting device 70 with this structure can be very effectively utilized as a side view LED package. Moreover, the external terminal block may be variously modified in structure.

For example, as shown in FIG. 9, when the external terminal block configured as a board is employed, the external terminal block of a final individual light emitting device may be exposed to three adjacent ones of the side surfaces of the package body, as shown in FIG. 11A.

Figure 12:
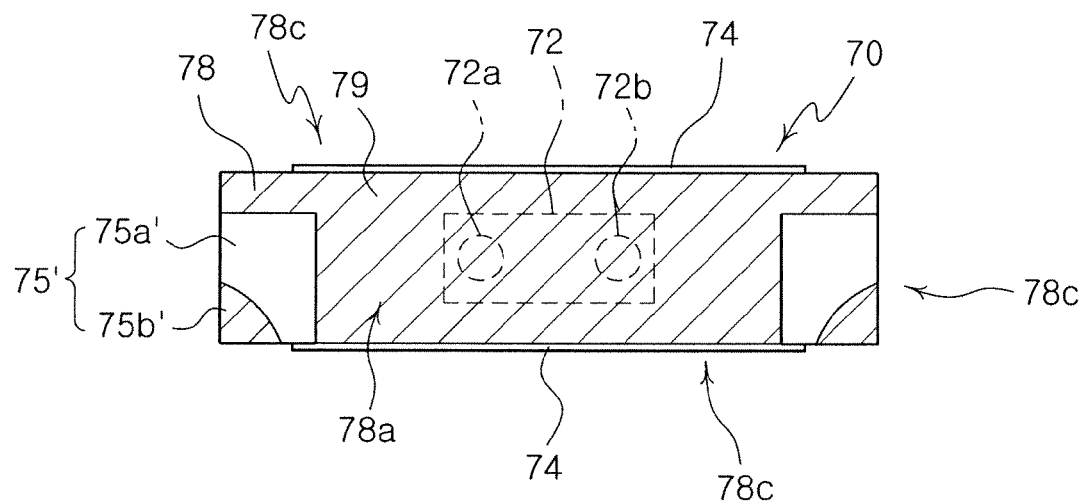
FIG. 12 is a plan view illustrating a light emitting device according to a second embodiment of the invention.

Alternatively, when the external terminal block 15 shown in FIG. 3 is employed, the external terminal block of the final individual light emitting device may be exposed to two adjacent ones of the side surfaces of the package body, as shown in FIG. 12. Also, a corresponding one of the side surfaces of the package body where the electrical contact part of the external terminal block is exposed serves as an area where the light emitting device is mounted. Particularly, in the present embodiment, the electrodes are not exposed on a corresponding one of the side surfaces opposing the mounting surface of the light emitting device. This accordingly prevents short of the package resulting from a metal cover placed after setting.

Unlike the aforesaid first embodiments, the second embodiment of the present embodiment employs a novel process of filling a resin by vacuum suction. FIGS. 13A to 13E are cross-sectional views illustrating a manufacturing process of a chip array structure in a method of manufacturing a light emitting device according to a second embodiment of the invention.

Figure 13A:
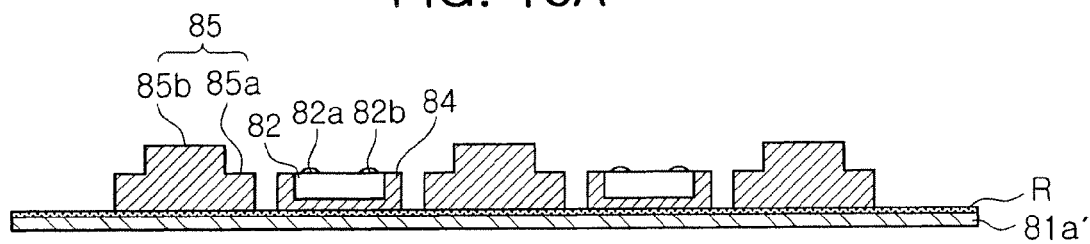
FIGS. 13A to 13D are cross-sectional views illustrating a manufacturing method of a chip array structure in a method of manufacturing a light emitting device according to a second embodiment of the invention.

First, as shown in FIG. 13A, external terminal blocks 85 and LED chips 82 are arranged on a first sheet 81a' having a curable material R applied thereon.

Each of the LED chips 82 has an electrode surface where electrodes 82A and 82B of opposite polarities are formed. The LED chip 82 may include resin layers 84 formed on a surface opposite to the electrode surface and a side surface, respectively. The resin layers 84 may include a phosphor powder for converting wavelength. Particularly, a phosphor-containing portion of the resin layers may be provided on the surface opposite to the electrode surface, which will serve as a light exiting surface of the LED chips 82.

The external terminal block 85 of the present embodiment is formed of a conductor block having a step structure. A step surface 85a of the external terminal block 85 is connected to electrodes 82a and 82b of the LED chip 82. Also, a top end 85b of the external terminal block 85 serves as a connection area for a final light emitting device. To this end, the external terminal block may have a thickness identical to a height of the final light emitting device.

The LED chips and external terminal blocks of the present embodiment are arranged in a similar manner to those of the first embodiment.

Figure 13B:
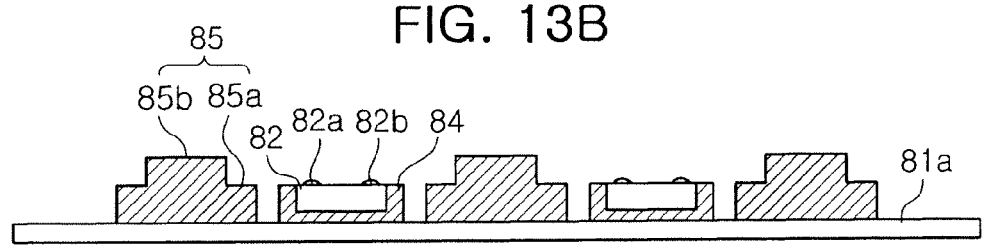

Thereafter, as shown in FIG. 13B, the LED chip 82 and the external terminal block 85 arranged on the first sheet 81a' are attached by curing an adhesive material R on the first sheet 81a.

To perform this process, the LED chips 82 and the external terminal block 85 may be pressed adequately and then an adhesive curable material may be cured. For example, in a case where a curable material is an ultraviolet ray (UV) curable resin, the ultraviolet ray may be irradiated to attach the LED chips 82 and the external terminal blocks 85. In the present embodiment, the adhesive curable material is additionally applied but the first sheet 81a may be a curable resin.

Figure 13C:
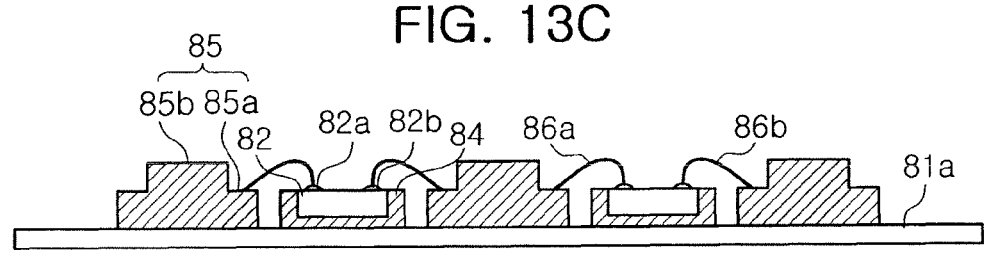

Next, as shown in FIG. 13C, the electrodes 82A and 82B of each of the LED chips 82 are connected to adjacent ones of the external terminal blocks 85.

In each of the external terminal blocks 85 of the present embodiment, a portion connected to the LED chip 82 serves as a step surface 85a. The step surface 85a of the external terminal block 85 as well as the electrode surface is arranged to be located at a top, thereby facilitating wires bonding. Moreover, in the present embodiment, the external terminal block 85 is formed of a conductive material. This accordingly allows a top end 85b to be exposed in a final package to be electrically connected to the step surface. Therefore, the top end 85b of the external terminal block 85 can serve as an area where the final light emitting device is connected to the outside.

Figure 13D:
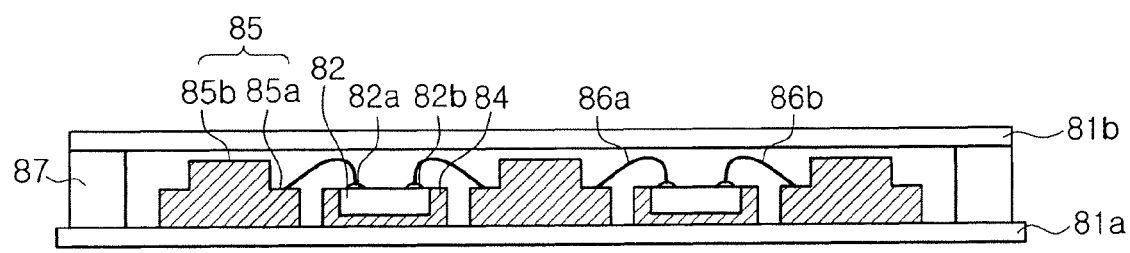

Thereafter, as shown in FIG. 13D, a spacer 87 is disposed to surround the LED chip 82 and the external terminal block 85 and provided with at least one inlet (I in FIG. 16). A second sheet 81b is attached on the spacer 87.

The spacer 87 has a predetermined height and together with the first and second sheets 81a and 81b, defines an inner space of the chip array structure. The spacer may have a height equivalent to a thickness of the final light emitting device. In the present embodiment, the spacer has a height substantially identical to a thickness of the external terminal block.

As shown in FIG. 16, the inner space of the chip array structure has two inlets I formed on opposing side walls to be connected to the outside. The inlets I serve as a supply conduit of a resin surrounding a surface of the LED chip in a later process.

As in the present embodiment, the plurality of inlets I are formed on the opposing sides to thereby ensure smoother injection of the resin. However, in the present invention, the inlets I are not limited in number or position and only a single inlet may be sufficient depending on size of the arrangement area and arrangement spacings.

Figure 17A:
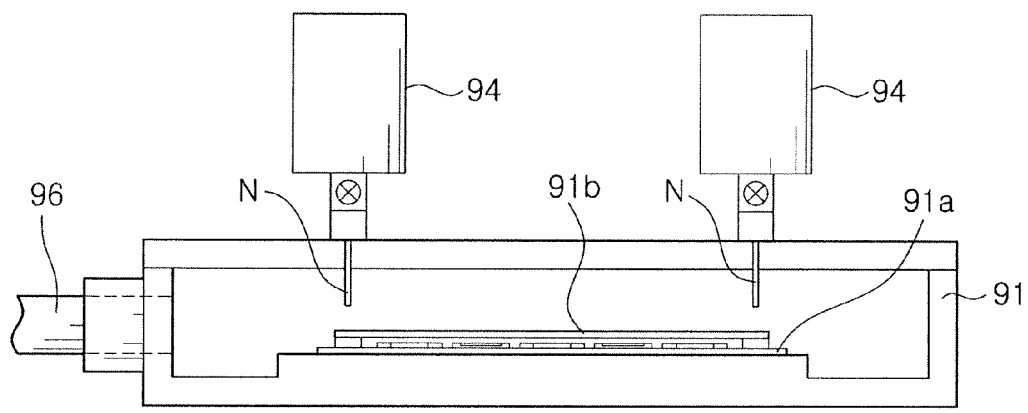
FIG. 17A is a side cross-sectional view and FIG. 17B is an internal plan view illustrating a vacuum chamber applicable to the present invention, respectively.
Figure 17B:
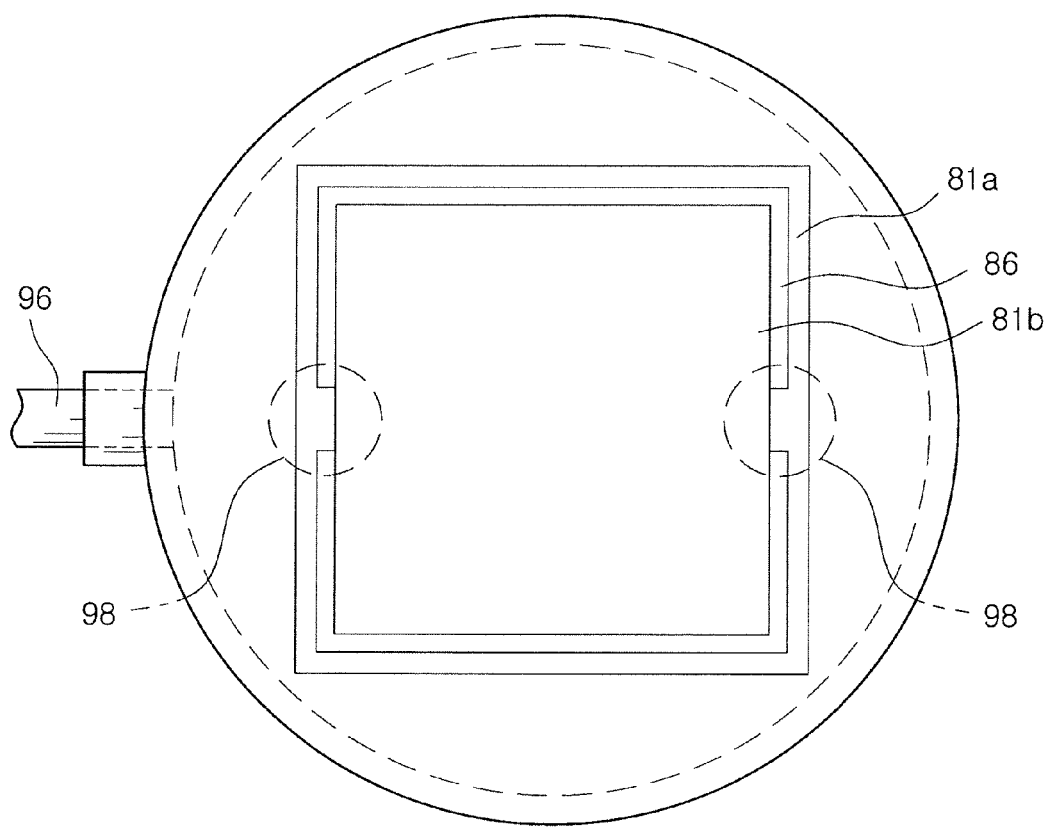

The chip array structure shown in FIG. 13D may have the resin filled therein using a vacuum chamber shown in FIGS. 17A and 17B.

FIG. 17A is a cross-sectional view and FIG. 17B is an internal plan view illustrating a vacuum chamber applicable to the present invention, respectively.

As shown in FIGS. 17A and 17B, the vacuum chamber apparatus includes a chamber 91, a vacuum value 96 provided at one side of the chamber 91 and a shelf disposed inside the chamber 91. The inner space of the chamber 91 is decompressed via a vacuum valve 96 to be changed into a vacuum or low pressure state.

A resin storage 94 is disposed on a top of the chamber 91 to drop a curable liquid resin 88' onto a desired location. In the present embodiment, as shown, the resin storage 94 may be disposed in a portion adjacent to the inlets I to allow the inlets I of the spacer 87 to be sealed.

Hereinafter, with reference to FIG. 14A to 14D, an exemplary method of manufacturing chip parts will be described according to a second embodiment. The present embodiment is construed to be implemented based on the vacuum chamber shown in FIGS. 17A and 17B, and the method will be described in greater detail with reference to FIGS. 14A and 14B.

Figure 14A:
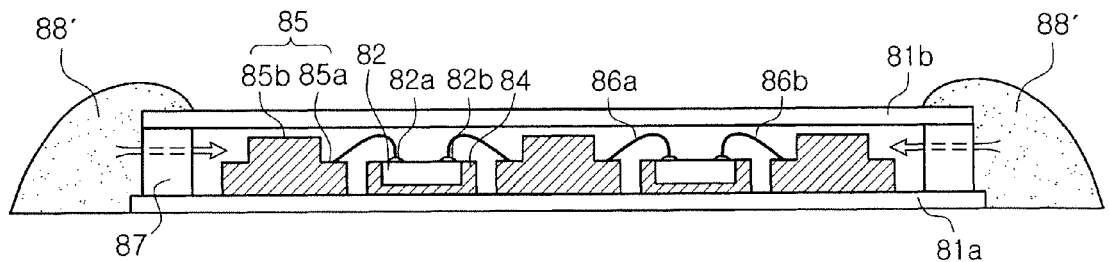
FIGS. 14A to 14D are cross-sectional views illustrating a manufacturing process of an individual light emitting device in a method of manufacturing a light emitting device according to a second embodiment of the invention.

As shown in FIG. 14a, with a chip array structure disposed inside a chamber 91, the chamber has an inner space changed into a vacuum or low pressure state via a vacuum valve 96. Also, a curable liquid resin 88' is dropped onto inlets I of the spacer 87.

The chamber 91 may be changed into a vacuum state inside by the decompression process, but may be in an adequate low pressure state to ensure a resin described below to be sucked. By this decompression process, not only the inner space of the chamber 91 but also the inner space of the chip array structure can be changed to be under the same pressure through the inlets I.

In the decompression process, the curable liquid resin 88' is previously disposed inside the chamber 91 to be de-aired. This precludes a need for an additional process for de-airing the liquid resin 88'.

Afterwards, as shown, the curable liquid resin 88' is dropped in a sufficient amount to cover the inlets I, thereby substantially sealing the inner space of the chip array structure.

Figure 14B:
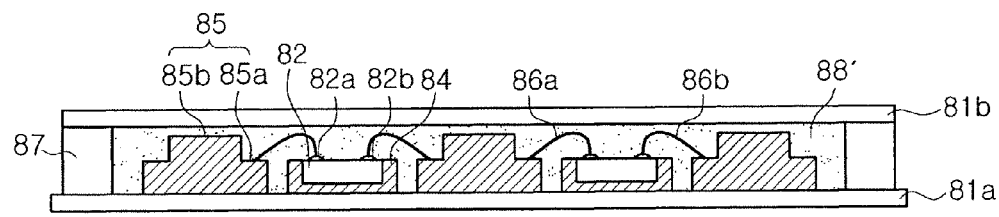

Then, the chamber is reverted back to its original state by a vacuum value 96. This produces a chip array structure having the curable liquid resin 88' filled in an inner space thereof as shown in FIG. 14b.

In this process, the chamber 91 is drastically increased in inner pressure but the inner space of the chip array structure can maintain a low pressure or vacuum state by the curable liquid resin 88' sealing, even if temporality, the inlets I. This accordingly leads to high pressure difference between the inner space of the chip array structure and other outer space, i.e., inner space of the chamber 91. This pressure difference allows the curable liquid resin 88' to be injected into the inner space of the chip array structure through the inlets I and be filled in the inner space, as indicated with arrows of FIG. 14A. In this process, to ensure the resin 88' to be filled more effectively, viscosity of the resin, and position, shape and amount of the dropped resin may be adjusted.

Figure 14C:
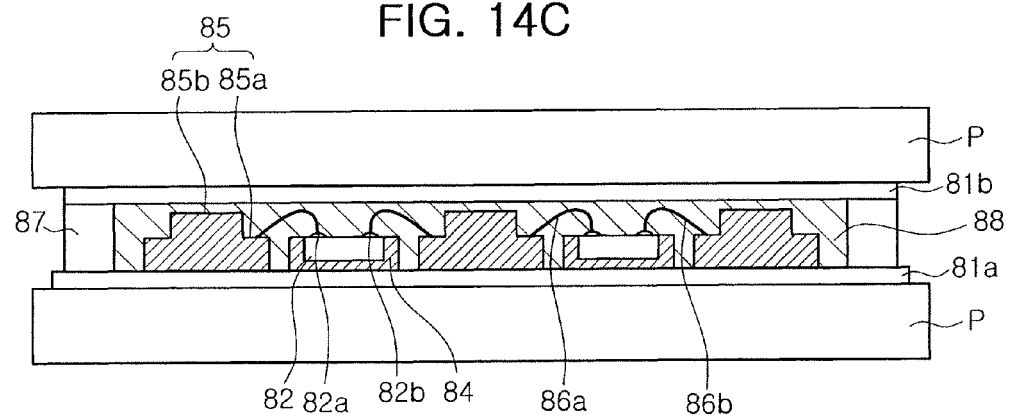
Figure 14D:
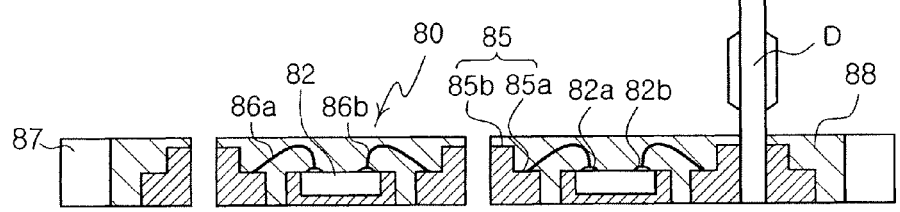

Thereafter, as shown in FIG. 14C, the curable liquid resin 88' filled in the inner space of the chip array structure is cured. This curing can be performed using heat or ultraviolet ray irradiation depending on type of resin. The curing may be directly performed inside the chamber 91, but the chip array structure may be picked up to be cured outside the chamber 91 by an additional curing apparatus P. The cured resin 88 may be present on all surfaces excluding a first surface 82a of the LED chip 82 protected by the first sheet 81a.

Finally, the first and second sheets 81a and 81b are removed from the chip array structure and the chip array structure is diced into a desired size to obtain a plurality of light emitting devices 80.

The first and second sheets 81a and 81b may be removed from the chip array structure by appropriate chemical and mechanical methods known in the art. After the sheets 81a and 81b are removed, the chip array structure is diced using a dicing apparatus D.

In the manufacturing method of the present embodiment, the curable liquid resin is injected in a vacuum state. The resin injected in a vacuum state (see FIG. 14A) allows pressure to be imposed on the chip array structure. Thus, the second sheet should be supported by the external terminal block. Accordingly, the external terminal block may have a height equivalent to a height of a package.

Of course, in a case where the second sheet is formed of a rigid material which does not undergo warping without an additional support structure even at a pressure applied when the resin is injected in a vacuum state, this process of filling the resin by vacuum suction may be beneficially applied to a light emitting structure employing the external terminal block having a low height as shown in FIGS. 1 and 8.

In the light emitting device of the present embodiment, the external terminal block has a height identical to a height of the light emitting device and a step provided on a side surface thereof. Therefore, a step surface of the external terminal block is connected to the LED chip through wires. Also, a top end of the external terminal block may be exposed to serve as a connection area for the external terminal block. This structure can be advantageously utilized as a top view light emitting package structure.

Figure 15A:
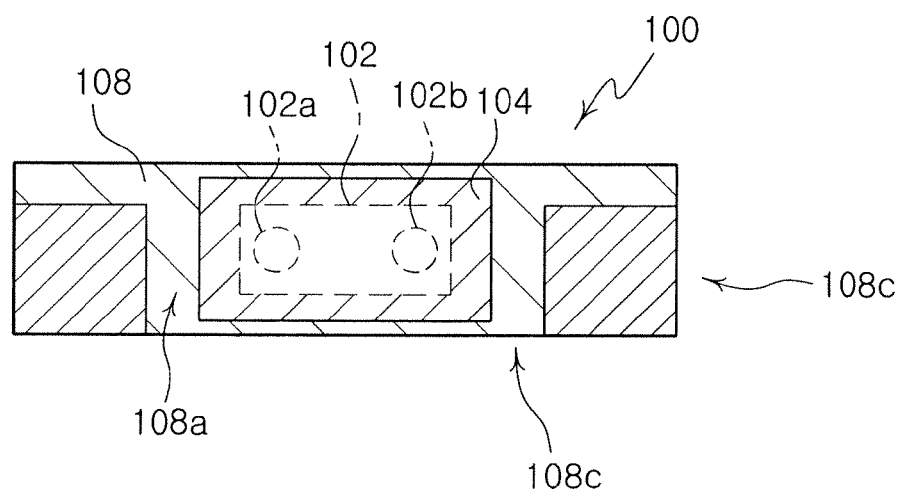
FIG. 15A is a plan view and FIG. 15B is a side cross-sectional view illustrating the light emitting device shown in FIG. 12D, respectively.
Figure 15B:
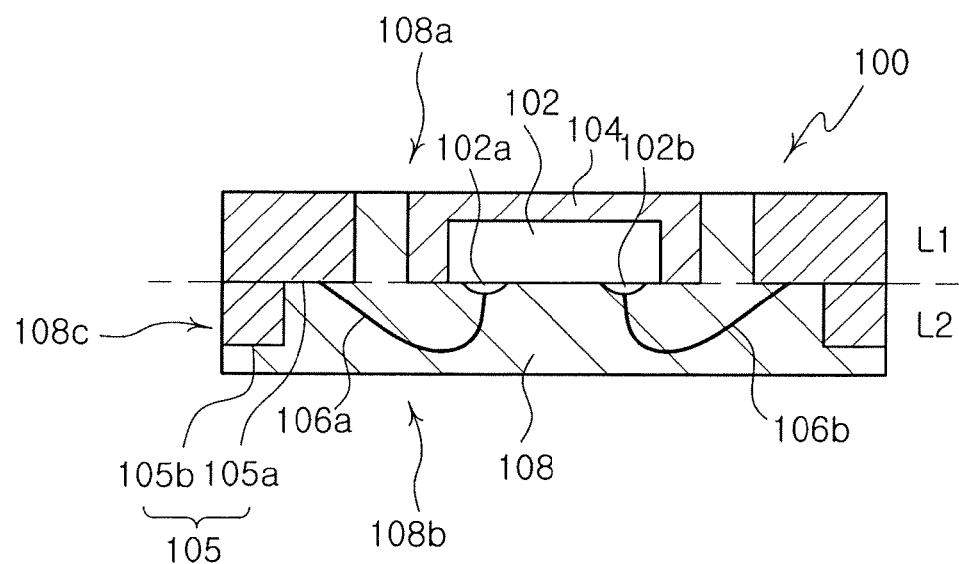

FIG. 15A is a plan view and FIG. 15B is a cross-sectional view illustrating a light emitting device obtained by a manufacturing method of FIGS. 13 and 14, respectively.

Referring to FIGS. 15A and 15B, the light emitting device 100 includes a package body 108 formed of a curable resin. The package body 108 has first and second circumferential surfaces 108a and 108b opposing each other and a side surface 108c disposed therebetween. The first and second circumferential surfaces 108a and 108b and the side surface 108c of the package body 108 are planar.

The package body 108 may be a transparent resin containing electrically insulating and high-reflectivity powder to reduce loss from light absorption by other components. The high-reflectivity powder may adopt a $TiO_2$ powder.

First and second external terminal blocks 105 are disposed at both edges of the package body 108. Unlike the first embodiment, in the present embodiment, the first and second external terminal blocks 105 each have a height identical to a height of the package body 108 and a step is formed on a side surface facing an LED chip 102. Also, the first and second external terminal blocks 105 may be formed of a conductive material. Therefore, a step surface 105a which is to be connected to LED chips 102 and a top end 105b exposed to the second circumferential surface 108b of the package body may be electrically connected to each other.

To explain the structure of the light emitting device 100 of the present embodiment more easily, the package body 108 is construed to be divided into first and second level areas L1 and L2 including the first and second circumferential surfaces 108a and 108b, respectively based on a surface of the LED chip 102 where electrodes 102a and 102b are formed.

The LED chip 102 is located between the first and second external blocks 105 in the first level area L1 and an electrode surface where the first and second electrodes 102a and 102b are formed faces the second level area L2. The LED chip 102 may be connected to step surfaces 105a of the first and second external terminal blocks 105 by wires 106a and 106b, respectively. Also, the wires 106a and 106b can be located in the second level area L2 of the package body 108 to be protected.

In the light emitting device of the present embodiment, a top end 105b of the external terminal block exposed to the second circumferential surface 108b of the package body 108 serves as an area where the light emitting device is connected to the outside. This accordingly allows the light emitting device to be bonded by surface mount technology so that the second circumferential surface 108b of the package body 108 can serve as a mounting surface. The light emitting device 100 of this structure can be very effectively used as a top view LED package.

In present embodiment, the external terminal block 105 is configured such that the second circumferential surface 108b opposing the first circumferential surface 108a provides an area where the light emitting device can be connected to an external circuit. To realize this structure, as described above, the external terminal block 105 has a height identical to a height of the package body 108 and has a step formed on a side surface thereof to serve as an area for connecting the LED chip 102.

Figure 18A:
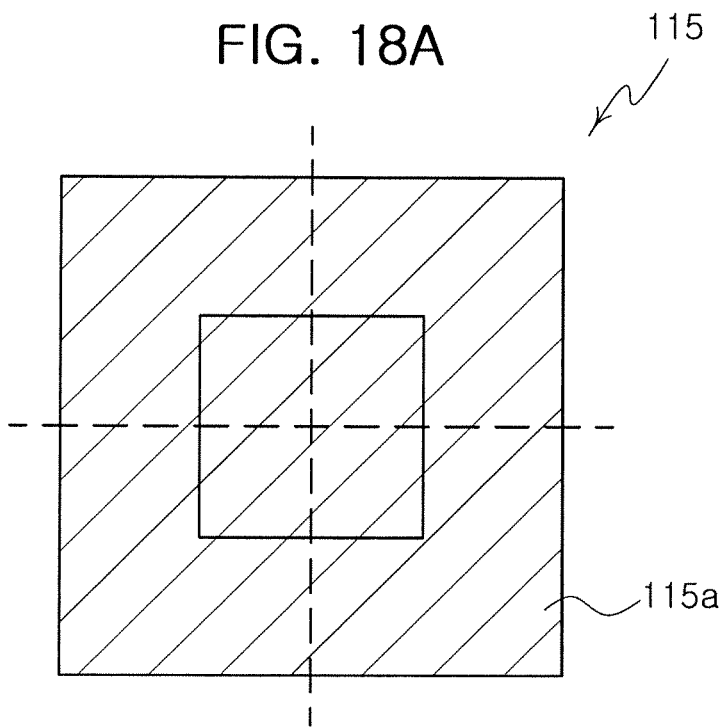
FIG. 18A is a top plan view and FIG. 18B is a side cross-sectional view illustrating an external terminal block applicable to the second embodiment of the invention.

This external terminal block may be varied in structure. FIG. 18A is a top plan view and FIG. 18B is a side cross-sectional view illustrating an external terminal block applicable to the second embodiment of the invention.

Figure 18B:
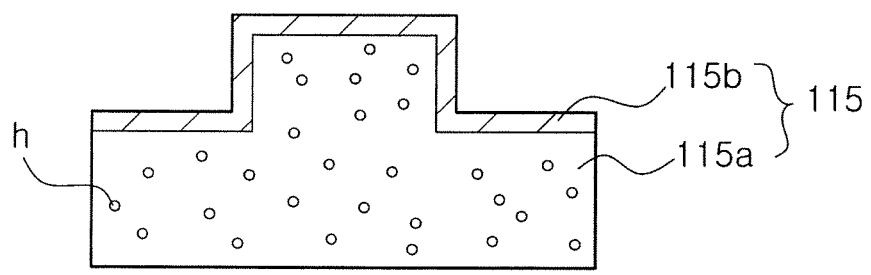

The external block 115 shown in FIGS. 18A and 18B is divided into quarters along dotted lines to be used as respective external terminals in an individual package.

The external terminal block 115 includes an insulating block 115a having a height substantially identical to a height of the package body and provided with a step facing an LED chip. The insulating block 115a may be formed of a porous ceramic body having a plurality of pores h to be more strongly bonded to the package body made of resin. As described above, to assure stronger bonding, the pores may have a porosity of about 10 to 60% and a pore diameter of about 0.1 to 1.3 μm.

A step surface of the block 115 is located inside the package body to be connected to electrodes of the LED chip. The block 115 has a top end exposed to a mounting surface of the package body to connect to an external circuit. To realize such an external terminal structure, an electrode layer 115b is formed on the top end of the external terminal block 115 along the step surface of the external terminal block 115 to electrically connect the LED chip to the exposed top end.

As set forth above, according to exemplary embodiments of the invention, an additional case is not employed to achieve a sufficiently compact and novel light emitting device. Also, unlike a conventional technology entailing a process of forming a resin encapsulant in addition to a process of injection-molding the case, a whole structure is manufactured in a single process, and an additional machining process for a lead frame is not required. This beneficially allows for mass production of compact packages. Moreover, the light emitting device can be sized uniformly by suitably designing a chip array structure to ensure precise processes, thereby producing a higher-quality light emitting device with more efficiency.

While the present invention has been shown and described in connection with the exemplary embodiments, it will be apparent to those skilled in the art that modifications and variations can be made without departing from the spirit and scope of the invention as defined by the appended claims.

What is claimed is:

1. A light emitting device, comprising:
a package body having a first surface, a second surface opposing the first surface thereof and side surfaces disposed therebetween, the package body being formed of a curable resin;
first and second external terminal blocks disposed in the package body, respectively, and having an electrical contact part, wherein each of the first and second external terminal blocks has a first surface being substantially coplanar with the first surface of the package body, a second surface opposing the first surface thereof and side surfaces disposed therebetween, at least one of the side surfaces being substantially coplanar with at least one of the side surfaces of the package body to have an exposed portion;
a light emitting diode chip disposed between the first and second external terminal blocks in the package body and having an electrode surface where first and second electrodes are disposed and a main surface opposing the electrode surface, the electrode surface facing the second surface of the package body and the main surface being substantially coplanar with the first surface of the package body; and
wires disposed in the package body and electrically connected to first and second electrodes of the light emitting diode chip to the electrical contact parts of the first and second external terminal blocks, respectively, wherein:
the electrical contact part extends from the inside of the package body to the exposed portion of the side surface of each of the first and second external terminal blocks, and
two adjacent side surfaces of at least one of the first and second external terminal blocks are exposed and substantially coplanar with two adjacent side surfaces of the package body, respectively.

2. The light emitting device of claim 1, wherein the light emitting diode chip comprises a transparent resin layer formed on at least a side surface thereof.

3. The light emitting device of claim 2, wherein the light emitting diode chip comprises transparent resin layers formed on the side surface and the main surface thereof.

4. The light emitting device of claim 3, wherein a corresponding one of the transparent layers formed on the main surface of the light emitting diode chip comprises a phosphor powder.

5. The light emitting device of claim 1, further comprising a phosphor layer formed on at least an area of the first surface of the package body, where the light emitting diode chip is positioned.

6. The light emitting device of claim 5, wherein the curable resin of the package body has a refractivity of 1.5 or less.

7. The light emitting device of claim 5, further comprising side reflective layers formed on two opposing ones of the side surfaces of the package body to cover the area of the light emitting diode chip.

8. The light emitting device of claim 7, wherein the side reflective layers are formed of a resin containing a high-reflectivity powder.

9. The light emitting device of claim 8, wherein the high-reflectivity powder comprises a $TiO_2$ powder.

10. The light emitting device of claim 1, wherein each of the first and second external terminal blocks has the second surface located inside the package body and
the electrical contact part is formed to connect from the second surfaces of the first and second external terminal blocks to the exposed portions of the side surfaces of the first and second external terminal blocks, respectively.

11. The light emitting device of claim 10, wherein each of the first and second external terminal blocks comprises:
an insulating block having first and second surfaces substantially coplanar with the first and second surfaces of the first and second external terminal blocks, respectively,
wherein the insulating block has a conductive via hole extending through the first and second surfaces of the insulating block and exposed at the at least one of the side surfaces of the package body.

12. The light emitting device of claim 11, wherein two adjacent side surfaces of the first and second external terminal blocks are exposed to two adjacent side surfaces of the package body, respectively.

13. The light emitting device of claim 11, wherein three adjacent sides of the first and second external terminal blocks are exposed to three adjacent side surfaces of the package body, respectively.

14. The light emitting device of claim 11, wherein the electrical contact part of the each of the first and second external terminal blocks further comprises an electrode layer formed on the second surface of the insulating block to connect to the conductive via hole.

15. The light emitting device of claim 11, wherein the each of the first and second external terminal blocks further comprises:
a metal layer formed on the first surface of the insulating block to connect to the conductive via hole; and
a light absorption prevention layer formed on the first surface of the insulating block to cover the metal layer and formed of a resin containing a high-reflectivity powder.

16. The light emitting device of claim 11, wherein the insulating block is one of a ceramic block and a printed circuit board block.

17. The light emitting device of claim 16, wherein the ceramic block has a porous structure.

18. The light emitting device of claim 17, wherein the porous structure has a porosity of 10 to 60% and a pore diameter of 0.1 to 1.3 μm.

19. The light emitting device of claim 1, wherein the each of the first and second external terminal blocks has a step formed on a surface facing the light emitting diode chip and has the second surface exposed to the second surface of the package body, and
the electrical contact part is formed to connect from the step to the exposed second surface of the each of the first and second external terminal blocks.

20. The light emitting device of claim 19, wherein the first and second external terminal blocks are formed of an electrically conductive material capable of serving as the electrical contact part.

21. The light emitting device of claim 1, wherein the curable resin comprises an electrically insulating high-reflectivity powder.

22. The light emitting device of claim 21, wherein the high-reflectivity powder comprises a $TiO_2$ powder.

23. The light emitting device of claim 1, further comprising a zener diode disposed in the package body, the zener diode attached on one of the first surface of the each of the first and second external terminal blocks and the electrode surface of the light emitting diode chip to electrically connect to the electrical contact part and one of the first and second electrodes.

24. The light emitting device of claim 1, further comprising a heat radiator disposed in the package body and attached on the light emitting diode chip.

25. The light emitting device of claim 1, wherein the first and second surfaces and side surfaces of the package body are planar.

26. A light emitting device, comprising:
a package body having a first surface, a second surface opposing the first surface thereof and side surfaces disposed therebetween, the package body being formed of a curable resin;
first and second external terminal blocks disposed in the package body, respectively, and having an electrical contact part, wherein each of the first and second external terminal blocks has a first surface being substantially coplanar with the first surface of the package body, a second surface opposing the first surface thereof and side surfaces disposed therebetween, at least one of the side surfaces being substantially coplanar with at least one of the side surfaces of the package body to have an exposed portion;
a light emitting diode chip disposed between the first and second external terminal blocks in the package body and having an electrode surface where first and second electrodes are formed and a main surface opposing the electrode surface, the electrode surface facing the second surface of the package body and the main surface being substantially coplanar with the first surface of the package body; and
wires disposed in the package body and electrically connected to first and second electrodes of the light emitting diode chip to the electrical contact parts of the first and second external terminal blocks, respectively, wherein:
the electrical contact part is formed to be extended from the inside of the package body to the exposed portion of the side surface of each of the first and second external terminal blocks, and
the exposed portions of the first and second external terminal blocks are provided on the same side surface of the package body.

27. A light emitting device, comprising:
a package body having a first surface, a second surface opposing the first surface thereof and side surfaces disposed therebetween, the package body being formed of a curable resin;
first and second external terminal blocks disposed in the package body, respectively, and having an electrical contact part, wherein each of the first and second external terminal blocks has a first surface being substantially coplanar with the first surface of the package body, a second surface opposing the first surface thereof and side surfaces disposed therebetween, at least one of the side surfaces being substantially coplanar with at least one of the side surfaces of the package body to have an exposed portion;
a light emitting diode chip disposed between the first and second external terminal blocks in the package body and having an electrode surface where first and second electrodes are disposed and a main surface opposing the electrode surface, the electrode surface facing the second surface of the package body and the main surface being substantially coplanar with the first surface of the package body; and
wires disposed in the package body and electrically connected to first and second electrodes of the light emitting diode chip to the electrical contact parts of the first and second external terminal blocks, respectively, wherein:
the electrical contact part extends from the inside of the package body to the exposed portion of the side surface of each of the first and second external terminal blocks,
each of the first and second external terminal blocks comprises an insulating block having first and second surfaces substantially coplanar with the first and second surfaces of the first and second external terminal blocks, respectively, and
the insulating block has a conductive via hole extending through the first and second surfaces of the insulating block and exposed at the at least one of the side surfaces of the package body.

* * * * *